United States Patent
Otto et al.

(10) Patent No.: US 9,972,423 B2
(45) Date of Patent: May 15, 2018

(54) REINFORCED SUPERCONDUCTING WIRE AND METHOD FOR MANUFACTURING THE SAME

(71) Applicants: Sumitomo Electric Industries, Ltd., Osaka-shi, Osaka (JP); Alexander Otto, Groton, MA (US)

(72) Inventors: Alexander Otto, Groton, MA (US); Kouhei Yamazaki, Osaka (JP)

(73) Assignees: SUMITOMO ELECTRIC INDUSTRIES, LTD., Osaka-shi, Osaka (JP); SOLID MATERIAL SOLUTIONS, LLC, Chelmsford, MA (US)

(*) Notice: Subject to any disclaimer, the term of this patent is extended or adjusted under 35 U.S.C. 154(b) by 34 days.

(21) Appl. No.: 14/898,302

(22) PCT Filed: Jun. 10, 2014

(86) PCT No.: PCT/JP2014/003093
§ 371 (c)(1),
(2) Date: Dec. 14, 2015

(87) PCT Pub. No.: WO2014/203494
PCT Pub. Date: Dec. 24, 2014

(65) Prior Publication Data
US 2016/0141080 A1    May 19, 2016

Related U.S. Application Data

(60) Provisional application No. 61/836,805, filed on Jun. 19, 2013.

(51) Int. Cl.
*H01B 12/00*    (2006.01)
*H01B 12/06*    (2006.01)
(Continued)

(52) U.S. Cl.
CPC ............. *H01B 12/06* (2013.01); *C22C 30/00* (2013.01); *H01L 39/143* (2013.01); *H01L 39/248* (2013.01); *H01L 39/2454* (2013.01)

(58) Field of Classification Search
CPC ........ H01L 39/248; H01B 12/06; H01B 12/10
USPC ........................................ 505/239
See application file for complete search history.

(56) References Cited

U.S. PATENT DOCUMENTS 5,059,582 A    10/1991    Chung
5,086,035 A    2/1992    Hung et al.
(Continued)

FOREIGN PATENT DOCUMENTS

CN    101292369 A    10/2008
JP    H05-70132 A    3/1993
(Continued)

OTHER PUBLICATIONS

Toplosky et al. "Mechanical Properties of Cold-rolled and Aged MP35N Alloys for Cryogenic Magnet Applications" AIP Conf. Proc. 1435, 125-132 (Jun. 12, 2012).*
(Continued)

*Primary Examiner* — Paul Wartalowicz
(74) *Attorney, Agent, or Firm* — Drinker Biddle & Reath LLP

(57) ABSTRACT

Reinforced materials for high temperature superconducting tape. More specifically reinforcement materials for significantly reducing the amount of required reinforcement and attaining much higher stress tolerances at practical conductor dimensions are described herein.

14 Claims, 11 Drawing Sheets

(51) Int. Cl.
*H01L 39/24* (2006.01)
*H01L 39/14* (2006.01)
*C22C 30/00* (2006.01)

(56) References Cited

U.S. PATENT DOCUMENTS

| | | | |
|---|---|---|---|
| 5,379,020 A | 1/1995 | Meier et al. | |
| 5,801,124 A | 9/1998 | Gamble et al. | |
| 5,987,342 A | 11/1999 | Scudiere et al. | |
| 6,230,033 B1 | 5/2001 | Scudiere et al. | |
| 6,711,421 B2 | 3/2004 | Wang et al. | |
| 2003/0059652 A1 | 3/2003 | Wang et al. | |
| 2006/0073979 A1 | 4/2006 | Thieme et al. | |
| 2010/0075857 A1* | 3/2010 | Ayai | H01L 39/248 505/230 |
| 2011/0244234 A1 | 10/2011 | Taneda et al. | |
| 2015/0045230 A1* | 2/2015 | Shingai | H01B 12/02 505/230 |

FOREIGN PATENT DOCUMENTS

| | | | | |
|---|---|---|---|---|
| JP | 2008-282584 A | 11/2008 | | |
| JP | 2009-503794 A | 1/2009 | | |
| JP | 2011-192422 A | 9/2011 | | |
| JP | 2012-169237 A | 9/2012 | | |
| WO | WO 2013/153973 | * 10/2013 | | H01B 12/02 |

OTHER PUBLICATIONS

AIP Conference Proceedings Table of Contents (Jun. 12, 2012).*
A. Otto et al., "Advances in the Brass and Stainless Steel Reinforcement of High Temperature Superconducting Wires", IEEE Transactions on Applied Superconductivity, vol. 17, No. 2, Jun. 2007, pp. 3071-3074.
A. Otto et al., "Critical current retention in axially strained reinforced first-generation high-temperature superconducting Bi2223 wire", Superconductor Science and Technology, 18, 2005, S308-S312.

* cited by examiner

REINFORCED SUPERCONDUCTING WIRE AND METHOD FOR MANUFACTURING THE SAME

TECHNICAL FIELD

This application relates generally to reinforced materials for high temperature superconducting (HTS) tape, and the reinforced superconducting tape articles containing these materials. More specifically reinforcement materials for significantly reducing the amount of required reinforcement and attaining much higher stress tolerances at practical conductor dimensions are described herein.

BACKGROUND ART

Superconducting materials, in suitably developed forms, and at cryogenic temperatures, can transport without overheating, many times (in excess of 10 fold, and up to 100,000 fold) the electrical current that can be practically and economically transported by resistive materials such as copper, aluminum and silver of the same cross sectional area. For the purpose of clarity in this document, electrical conductors with cross-sectional shape aspect of less than about 3 are typically but not exclusively referred to as wires, while conductors with cross-sectional shape aspect greater than about 3 (FIGS. 1, 2, 4, 6, and 9) are referred to as tapes, and bundles comprised of two or more conductors are referred to as cables. All three types can be used to produce coils that can generate very large magnetic fields, in stationary magnet applications like MRI (Magnetic Resonance Imaging), NMR (Nuclear Magnetic Resonance) and accelerator magnets, as well as in moving magnet applications such as in for example wind generators. These conductors can also be used to transmit very large amounts of electric power in very high current cables over large distances with very little energy loss. In the case of magnets, the interaction between the moving charge in the conductor and large magnetic field can result in very large axial forces (the Lorentz force $F=IL \times B$ where I is electrical current, L is conductor length and B is magnetic field impinging on the conductor, and × denotes cross product) in the conductor at high fields, requiring reinforced conductors with very high levels of axial stress tolerance without degradation in conductor properties, primarily its current carrying capacity.

There is known a superconducting tape reinforced by adding a reinforcement member to receive such a stress (refer to, for example, U.S. Pat. No. 5,059,582, U.S. Pat. No. 5,801,124, U.S. Pat. No. 5,987,342, U.S. Pat. No. 6,230,033, U.S. Pat. No. 6,711,421, A. Otto, E. J. Harley and R. Mason, Supercond. Sci. Technol. 18 (2005) S308-S312, and A. Otto, E. Podtburg, R. Mason and P. Antaya, IEEE Transactions on Applied Superconductivity, Vol 17 pp. 3071-3074).

CITATION LIST

Patent Literature

PTL 1: U.S. Pat. No. 5,059,582
PTL 2: U.S. Pat. No. 5,801,124
PTL 3: U.S. Pat. No. 5,987,342
PTL 4: U.S. Pat. No. 6,230,033
PTL 5: U.S. Pat. No. 6,711,421

Non Patent Literature

NPL 1: A. Otto, E. J. Harley and R. Mason, Supercond. Sci. Technol. 18 (2005) S308-S312

NPL 2: A. Otto, E. Podtburg, R. Mason and P. Antaya, IEEE Transactions on Applied Superconductivity, Vol 17 pp. 3071-3074

SUMMARY OF INVENTION

Technical Problem

Although superconducting materials can transport much greater current densities than resistive materials, beyond a certain critical current (Ic) and corresponding critical current density level (Jc), they exhibit rapidly increasing resistance, limiting their use to the regime below Ic and Jc. Addition of reinforcement and other materials increases conductor cross sectional area, and therefore reduces the maximum engineering current density (Je) that the conductor can be operated at before reaching the intrinsic Jc of the superconducting material. It is therefore of great value and importance to add as little material as possible to attain a desired level of reinforcement (and insulation).

Solution to Problem

The present invention identifies a specific combination of 3 attributes in reinforcement materials and several specific fabrication conditions to produce HTS tapes with significantly improved axial tensile stress tolerance as compared to the best state of the art stress tolerance attained with stainless steel reinforcement of comparable cross-section dimension.

The critical reinforcement material attributes are elastic modulus, proportionality limit strain in tensile deformation beyond which irreversible plastic strain occurs, and coefficient of thermal expansion (CTE), all of which it is recognized in this invention, must exceed in combination, difficult to attain threshold levels.

The critical fabrication conditions are the high level of tensile load (resulting in tensile elastic strain) that must be applied to the reinforcement strip as it is bonded to the superconducting tape, and the highest practical temperature at which the attachment is completed.

The critical architectural feature, and the one that greatly improves the utility of reinforced superconductors, is the ratio of reinforcement to conductor cross-sectional area that is required to improve stress tolerance to a required level. The invention provides for much greater tensile stress tolerance at cross-sectional area ratios below 35% than what can and has been attained with state of the art stainless steel.

A reinforced superconducting tape according to an aspect of the present invention includes: a superconducting tape portion; and a reinforcement member connected to the superconducting tape portion. A material forming the reinforcement member includes nickel, cobalt and chromium.

Advantageous Effects of Invention

According to the aforementioned aspect, there can be obtained a reinforced superconducting tape with increased tensile strength.

DESCRIPTION OF EMBODIMENTS

Figure 1:
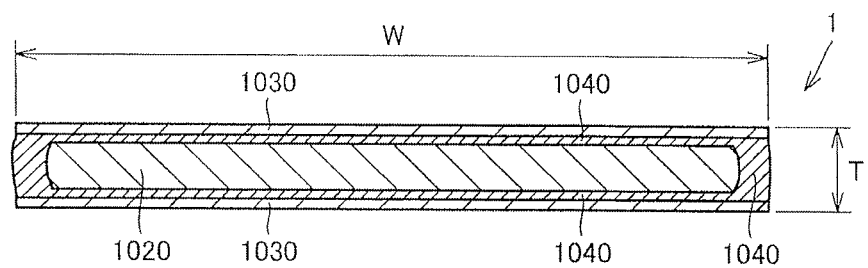
FIG. 1 is a schematic cross-sectional view of a reinforced superconducting tape according to an aspect of the present invention.

An embodiment of the present invention will be described hereinafter with reference to the drawings.

Description of Embodiment of the Present Invention

A reinforced superconducting tape 1 according to an aspect of the present invention includes a superconducting tape portion 120, 1020, and a reinforcement member 1030 connected to the superconducting tape portion. A material forming reinforcement member 1030 includes nickel, cobalt and chromium. Therefore, by using an alloy containing the aforementioned material as the reinforcement member, there can be obtained a reinforced superconducting tape with increased tensile strength, as compared with what is attained with the use of a reinforcement member made of conventional stainless steel.

In the aforementioned reinforced superconducting tape, the superconducting tape portion may include a bismuth-based superconducting conductor. A ratio of a cross sectional area of the reinforcement member to a cross sectional area of the reinforced superconducting tape may be 35% or less. The bismuth-based superconducting conductor herein is an oxide superconductor formed by Bi (bismuth)-Sr (strontium)-Ca (calcium)-Cu (copper)-O (oxygen), and refers to an oxide superconductor represented by a chemical formula of, for example, $(Bi,Pb)_2Sr_2Ca_2Cu_3O_x$. In this case, the ratio of the cross sectional area of the reinforcement member to the total cross sectional area of the reinforced superconducting tape is sufficiently low. Therefore, it is possible to reduce occurrence of the problem that when the reinforced superconducting tape is used to form a coil and the like, the amount of flowing current per unit cross sectional area of the coil becomes excessively small due to the presence of the reinforcement member.

In aforementioned reinforced superconducting tape 1, the superconducting tape portion may include an yttrium-based superconducting conductor. A ratio of a cross sectional area of the reinforcement member to a cross sectional area of the reinforced superconducting tape may be 80% or less. The yttrium-based superconducting conductor herein refers to a superconducting conductor including both an oxide superconductor represented by a chemical formula of $YBa_2Cu_3O_x$ and a rare earth-based oxide superconductor such as HoBCO (holmium-based superconducting material: $HoBa_2Cu_3O_x$) and GdBCO (gadolinium-based superconducting material: $GdBa_2Cu_3O_x$). In this case, the ratio of the cross sectional area of the reinforcement member to the total cross sectional area of the reinforced superconducting tape is sufficiently low. Therefore, it is possible to reduce occurrence of a problem that when the reinforced superconducting tape is used to form a coil and the like, the amount of flowing current per unit cross sectional area of the reinforced superconducting tape becomes excessively small due to the presence of the reinforcement member. The ratio of the cross sectional area of the reinforcement member to the cross sectional area of the reinforced superconducting tape may be 60% or less.

In aforementioned reinforced superconducting tape 1, a compressive stress may be applied to the superconducting tape portion along an extending direction of the superconducting tape portion. In this case, the aforementioned compressive stress serves as a resistance component to a tensile stress applied to reinforced superconducting tape 1. Therefore, higher critical tensile stress in the reinforced superconducting tape can be achieved, than the case of not applying the aforementioned compressive stress to the superconducting tape portion.

In aforementioned reinforced superconducting tape 1, in the material forming the reinforcement member, the nickel may be in a range from 20 wt % or more to 42 wt % or less, the cobalt may be in a range from 23 wt % or more to 44 wt % or less, and the chromium may be in a range from 14 wt % or more to 26 wt % or less. In this case, the strength of the reinforcement member can be reliably enhanced.

In aforementioned reinforced superconducting tape 1, the nickel may be in a range from 25 wt % or more to 37 wt % or less. In this case, the strength of the reinforcement member can be further enhanced.

In aforementioned reinforced superconducting tape 1, the cobalt may be in a range from 28 wt % or more to 39 wt % or less. In this case, the strength of the reinforcement member can be further enhanced.

In aforementioned reinforced superconducting tape 1, the chromium may be in a range from 19 wt % or more to 21 wt % or less. In this case, the strength of the reinforcement member can be further enhanced.

In aforementioned reinforced superconducting tape 1, the material forming the reinforcement member may further include titanium. In this case, the strength of the reinforcement member can be further enhanced.

In aforementioned reinforced superconducting tape 1, the reinforcement member may be such that a characteristic value FOM defined in accordance with the following equation may exceed 1050% GPa/K: FOM=CTE×Proportionality Limit Strain×Modulus all in the 273K to 323K temperature range, and where CTE is in PPM m/m/K, Elastic Modulus is in GPa and Proportionality Limit is in percent. By using the reinforcement member that meets this condition, the tensile strength of the reinforced superconducting tape can be reliably enhanced.

In aforementioned reinforced superconducting tape 1, a rate of decrease in a critical current value when a tensile stress of 400 MPa is applied, to a critical current value when a tensile stress is not applied may be 5% or less. In this case, a sufficiently high critical current value can be obtained even in the tensile stress-applied state. Therefore, when the reinforced superconducting tape is used to form a superconducting device such as a coil, the superconducting device can be operated in a stable manner.

A specific embodiment provided herein describes a reinforced high temperature superconductor comprised of a) a BSCCO 2223/silver tape core, b) two reinforcement strips, one on each side of the broad surfaces of the tape c) a joining material comprised primarily of an organic adhesive or solder containing in excess of 5% of any one of Sn, Pb, In, Sb, Bi or Zn between the reinforcement strips and BSCCO 2223/silver tape core, coating the outside of the assembly and between the reinforcement strips at the edges of the assembly such that the reinforcement occupies less than 35% of the total composite cross sectional area and where the critical current of the composite is not degraded by more than 5% with an applied tensile stress in excess of 400 MPa at a temperature of 300 K or lower.

With such a configuration, there can be obtained a reinforced superconducting tape with increased tensile strength, as compared with what is attained with the use of a reinforcement member made of conventional stainless steel.

A method for manufacturing a reinforced superconducting tape according to an aspect of the present invention includes the steps of: preparing a superconducting tape portion, and a reinforcement member made of a material including nickel, cobalt and chromium; and joining the reinforcement member to the superconducting tape portion.

In this case, the aforementioned reinforced superconducting tape can be obtained.

In the aforementioned method for manufacturing a reinforced superconducting tape, in the step of joining, the reinforcement member may be joined to the superconducting tape portion, with a tensile stress applied to the reinforcement member. In this case, a compressive stress can be applied to the superconducting tape portion by the reinforcement member. Therefore, the aforementioned compressive stress serves as a resistance component to a tensile stress applied to the reinforced superconducting tape. Therefore, there can be obtained a reinforced superconducting tape with higher critical tensile stress than the case of not applying the aforementioned compressive stress to the superconducting tape portion.

Specific embodiments provided herein describe a reinforced superconducting tape 1 comprised of BSCCO 2223 or Y123 based superconductor, silver matrix or metal substrate required to manufacture the high current density form of the superconducting oxide, and added reinforcement to a level of less than 35% and more preferably, 25% of the reinforced conductor cross-sectional area and with a tensile stress tolerance in excess of 400 MPa, and more preferably 500 MPa, where irreversible Ic degradation first exceeds 5% as measured by a transport 4 point test method.

In this test, voltage measuring electrical contacts are positioned on the reinforced superconductor inside of the region between electric current injecting contacts. Tensile stress and strain in the material is progressively increased while critical current is measured at each stress increment by sweeping current up to the onset of voltage. By this method the stress and strain resulting in the onset of irreversible Ic degradation in the superconducting material is determined at stress and strain conditions ranging from 300 K to 4 K.

Proportionality strain limit for the purpose of this invention can be practically estimated from high quality stress-strain data by applying a tighter, 0.01% to 0.05% offset strain criterion than the commonly used 0.2% level.

Figure 9:
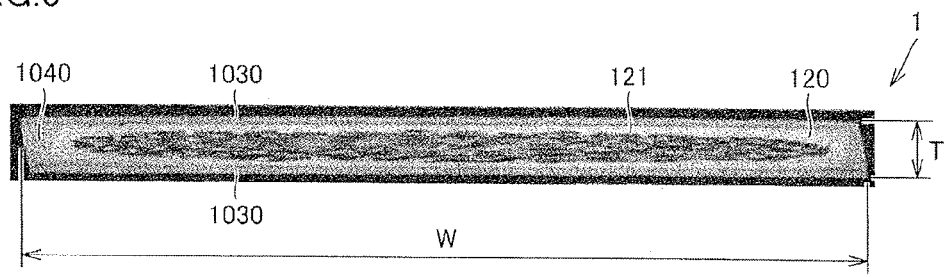
FIG. 9 is a photograph of a cross section of the reinforced superconducting tape according to the aspect of the present invention.

A specific embodiment provided herein and illustrated in FIG. 1 and FIG. 9 describes a reinforced high temperature superconductor comprised of a) a BSCCO 2223/silver tape core (superconducting tape portion 1020, 120) b) two reinforcement strips (reinforcement member 124 and 1030), one on each side of the broad surfaces of the tape in a sandwich structure c) a joining material 1040, comprised primarily of a solder containing in excess of 5% of any one of Sn, Pb, In, Sb, Bi or Zn between the reinforcement strips and BSCCO 223/silver tape core or an organic adhesive, coating the outside of the assembly and between the reinforcement strips at the edges of the assembly such that the reinforcement occupies less than 35% of the total cross sectional area of the cross-sectional architecture and where the critical current of the composite is not degraded by more than 5% with an applied tensile stress in excess of 400 MPa at a temperature of 323 K or lower. The typical BSCCO 2223/silver tape core has a cross sectional dimension in the range of 2 mm to 5 mm width, and thickness in the range of 0.15 mm to 0.3 mm thickness.

In a second embodiment (reinforced superconducting tape 1 in FIG. 2), 2 or more BSCCO 2223/silver tapes (superconducting tape portion 1020) in the above dimension range are stacked and adhered together by solder or an adhesive (a joining material 1040) between and to the reinforcement strips as described above to attain a stress tolerance in excess of 400 MPa at temperatures below 323 K, increasing the current of the conductor in approximate proportion to the number of BSCCO 2223/silver tapes included.

More specific embodiments provided herein describe a reinforcement material (material forming reinforcement member 124, 1030) as part of a composite superconducting conductor: wire, tape or cable; with the following combination of high CTE, modulus of elasticity and yield strain: Average CTE>$11 \times 10^{-6}$ m/m/K, from the attachment temperature to <110 K; Modulus exceeding 205 GPa at ambient temperature, and 220 GPa at <110K; Proportionality limit strain exceeding 0.45%.

Yet more specific embodiment provided herein describe a reinforcement with a figure of merit value FOM>1050% GPa/K, where FOM=CTE×Proportionality Limit Strain× Modulus. Where CTE is in PPM m/m/K, Elastic Modulus is in GPa and Proportionality Limit is in percent (as compared to stainless at a maximum value of approximately 950% GPa/K). Note: proportionality strain limit can be practically estimated from high quality stress-strain data by applying a tighter, 0.01% to 0.1% offset strain criterion than the commonly used 0.2% level.

The reinforced superconducting tape according to the aspect of the present invention and the method for manufacturing the same will be described hereinafter by listing its characteristic features.

1) A specific embodiment provided herein describes a reinforced superconducting tape comprised of BSCCO 2223 superconductor filaments, embedded in a silver matrix and added reinforcement area to a level of less than 35% of the cross-sectional area and with a tensile stress in excess of 400 MPa where irreversible Ic degradation first exceeds 5%.

2) A specific embodiment provided herein describes a reinforced superconducting tape comprised of an YBCO 123 or similar monofilament embedded in a substantially metal matrix, and added reinforcement area to a level of less than 60% of the cross-sectional area and with a tensile stress in excess of 400 MPa where irreversible Ic degradation first exceeds 5%.

3) A specific embodiment provided herein describes a reinforced high temperature superconductor comprised of a) a BSCCO 2223/silver tape core, b) two reinforcement strips, one on each side of the broad surfaces of the tape c) a joining material comprised primarily of an organic adhesive or solder containing in excess of 5% of any one of Sn, Pb, In, Sb or Bi between the reinforcement strips and BSCCO 2223/silver tape core, coating the outside of the assembly and between the reinforcement strips at the edges of the assembly such that the reinforcement occupies less than 35% of the total composite cross sectional area and where the critical current of the composite is not degraded by more than 5% with an applied tensile stress in excess of 400 MPa at a temperature of 300 K or lower.

4) A specific embodiment provided herein describes a reinforcement material as part of a composite superconducting conducting tape with the following combination of high CTE, modulus of elasticity and proportional limit yield strain.

Average CTE>$11\times10^{-6}$ m/m/K, from the attachment temperature above 273 K to the cryogenic operating temperature below 110 K.

Average modulus exceeding 205 GPa in the temperature range from 273 K to 373 K and 220 GPa at <110K.

Proportionality limit strain exceeding 0.45%.

5) A specific embodiment provided herein describes a reinforcement material with a figure of merit value, FOM>1050% GPA/K, where FOM=CTE×Proportionality Limit Strain*×Modulus all in the 273 K to 323 K temperature range, and where CTE is in PPM m/m/K, Elastic Modulus is in GPa and Proportionality Limit is in percent.

6) A specific embodiment provided herein describes a reinforcement strip that meets the requirements in 2), 3) and 4) above, and that contains at least Co>30 wt %, Cr>15 wt % and Ni>14%.

7) A specific embodiment provided herein describes a non magnetic reinforcement strip with the properties of 2), 3) and 4).

8) A specific embodiment provided herein describes a reinforcing material comprised of commercial alloys MP159, MP35N, Elgiloy, and similar commercial formulations meeting the criteria in 2), 3) and 4) above.

9) A specific embodiment provided herein describes a reinforcing material comprised of commercial alloys MP159, MP35N, Elgiloy, and similar commercial formulations with a proportionality limit in excess of 0.45% yield stress in excess of 1 GPa, ultimate tensile strength in excess of 1.6 GPa and elastic modulus in excess of 205 GPa.

10) A specific embodiment provided herein describes a BSCCO 2223/silver tape reinforced with commercial alloys MP159, MP35N, Elgiloy, and similar commercial formulations, with the reinforced composite exhibiting less than 5% irreversible Ic degradation while supporting an axial tensile stress in excess of 400 MPa at <300K.

11) A specific embodiment provided herein describes a reinforcement strip meeting 2) and 3) above, containing >20% Be.

12) A specific embodiment provided herein describes application of axial tensile stress to the reinforcement during attachment or incorporation into the composite to produce strain exceeding 50% of the proportionality limit and with the reinforcement material meeting the criteria in 2) through 4).

13) Specific embodiments provided herein describe above described reinforcement materials of 4), 5), 6), 7), 8), 9), and 11) with added surface material to a thickness of 10 micrometer or less, that enhances solder wetting, including for example copper, tin, gold, silver, platinum group metals, gallium, indium and any alloys containing any one of these elements.

14) A specific embodiment provided herein describes a superconducting tape comprising:
 a superconductor;
 a laminate supporting the superconductor; and
 an adhesion adhering the superconductor to the laminate,
 wherein the laminate is made from composition comprising at least Ni, Co, and Cr.

15) In the superconducting tape of 14),
 the Ni is in a range from 20 wt % or more to 42 wt % or less,
 the Co being in a range from 23 wt % or more to 44 wt % or less, and
 the Cr being in a range from 14 wt % or more to 26 wt % or less.

16) In the superconducting tape of 15),
 the Ni is in a range from 25 wt % or more to 37 wt % or less.

17) In the superconducting tape of 15),
 the Co is in a range from 28 wt % or more to 39 wt % or less.

18) In the superconducting tape of 15),
 the Cr is in a range from 19 wt % or more to 21 wt % or less.

19) In the superconducting tape of 14),
 the composition further comprising Ti in a range from 0.5 wt % or more to 3.6 wt % or less.

20) In the superconducting tape of 19),
 the composition further comprising Ti in a range from 1 wt % or more to 2.9 wt % or less.

21) In the superconducting tape of 14),
 a weight percent of the composition of the laminate is 100 wt % or less.

22) In the superconducting tape of 14),
 the superconductor comprises a composition having at least Bi, Sr, Ca and Cu, or at least Y, Ba and Cu.

Specific embodiments of the present disclosure will now be described. The invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which this invention belongs. The terminology used herein is for describing particular embodiments only and is not intended to be limiting of the invention. As used in the specification and appended claims, the singular forms "a," "an," and "the" are intended to include the plural forms as well, unless the context clearly indicates otherwise.

Unless otherwise indicated, all numbers expressing quantities of ingredients, properties such as molecular weight, reaction conditions, and so forth as used in the specification and claims are to be understood as being modified in all instances by the term "about," which is intended to mean a range from 90% or more to 110% or less of an indicated value. Additionally, the disclosure of any ranges in the specification and claims are to be understood as including the range itself and also anything subsumed therein, as well as endpoints. Unless otherwise indicated, the numerical properties set forth in the specification and claims are approximations that may vary depending on the desired properties sought to be obtained in embodiments of the present invention. Notwithstanding that numerical ranges and parameters setting forth the broad scope of the invention are approximations, the numerical values set forth in the specific examples are reported as precisely as possible. Any numerical values, however, inherently contain certain errors necessarily resulting from error found in their respective measurements.

Parts of methods described herein such as mathematical determinations, calculations, inputting of data for computations or determinations of equations or parts thereof can be performed on parts of or one or more computers or computer systems that can include one or more processors, as well as software to run or execute programs and run calculations or computations.

As used herein, the term "tape" refers generally to a high temperature superconducting composite with a width W that is at least 3 times greater than its thickness T (refer to FIGS. 1, 2, 4, 6, 9, 15, and 16). In certain sections of this document, this type of superconducting tape may also be referred to as a wire in view of the fact that wires are commonly understood to transmit electric current. Nevertheless, this invention pertains to high temperature superconductors that are described by the present definition of a superconductor having a tape shape with rectangular cross section of width greater than about 3 times its thickness.

As used herein, the term "strip" refers generally to the reinforcement material (reinforcement member 124, 1030) in a form that renders it suitable for attachment to the superconducting tape, generally with a width that is at least 5 times greater than its thickness, and that has been produced so as to make it adherent to the superconducting tape.

As used herein, the term "core" refers generally to the high temperature superconducting oxide composite tape (superconducting tape portion 120, 1020) that is placed between and attached to the reinforcement strips Reinforcing high temperature superconducting (HTS) tapes presents difficult challenges. HTS materials are oxides with the brittle properties of ceramics. They are therefore typically manufactured as metal ceramic composites. In the case of the currently most advanced and commercialized "BSCCO 2223" superconductor, the BSCCO superconducting oxide ((Bi,Pb)$_2$Sr$_2$Ca$_2$Cu$_3$O$_x$ compound) is manufactured into a multifilament tape form of nominal cross section in the range of 0.2 mm-0.25 mm thickness and 4 mm-4.5 mm width, with the matrix comprised of silver or a silver alloy between the typically 40-200 filaments 120. These filaments are reacted and sintered in-situ once the metal matrix-oxide filament tape is deformation processed. Although capable of transmitting very large electric currents, these BSCCO-silver tapes do not exhibit adequate stress, strain, bend and localized surface pressure tolerance for many applications, in the areas of high field magnets, rotating machines, and power cables. Therefore a lamination method (refer to FIGS. 8 and 9) has been developed for solder laminating suitably wetting reinforcement strips, one on each side of the BSCCO/silver composite core, as well as other types of HTS tapes, typically using a lead tin or high tin solder, and a solder dip technique (Ref PTD 1-5 and NPD 1 and 2). In order for this approach to work, the reinforcement strip has to be well wetted by solders, and available in long-length, thin, geometrically precise, nonmagnetic, environmentally stable, strip forms. Wetting of some reinforcement strips like the state of the art stainless steel is achieved by electroplating a metal onto the lamination strip such as copper or tin that readily wets the solder employed to attach the reinforcement strips to the core HTS tape. Other methods like chemical etching, hot dipping, vapor deposition and sputtering for example may also be employed to provide for improved wetting.

However, addition of reinforcement strips increases conductor cross-sectional area, thereby decreasing the maximum operating current density of the conductor, and this in turn very rapidly diminishes the utility of the HTS conductor in magnet applications. In the case of magnets, even a minor increase in conductor Je greatly increases its utility because it allows construction of a much smaller, more lightweight magnet. As a result, achieving a required level of stress tolerance with the least amount of added reinforcement is vital for increasing the utility of the HTS conductor. The reinforcement materials of embodiments of this invention provide the means for 1) greatly reducing the amount of required reinforcement to attain the same benefit as the current state of the art, and 2) attaining much higher stress tolerances at practical conductor dimensions.

Commercial BSCCO 2223 HTS tapes have been available that are reinforced with copper, brass or stainless steel. Among these, the greatest improvement in axial stress tolerance and bend properties is demonstrated with stainless steel strip in a hard temper state (Ref. NPD 2). A paper has also been published that describes some key aspects of the science behind reinforcement of high temperature superconducting tapes (Ref. NPD 1), and discusses some relationships between reinforcement properties and mechanical properties. But the specific attributes, materials and attachment conditions required to attain superior mechanical properties to stainless steel reinforced tapes in practical materials have not been described, nor has this been apparent from the prior art. In particular, the vital importance of four factors in combination has not been described, and practical materials that exceed the critical levels of these factors have not been identified.

The critical reinforcement material attributes are elastic modulus, proportionality limit in tensile deformation beyond which irreversible plastic strain occurs, and coefficient of thermal expansion (CTE), all of which must exceed in combination, difficult to attain threshold levels.

The critical fabrication conditions are the high level of tensile load and resulting highest possible tensile elastic strain that must be applied to the reinforcement strip as it is bonded to the superconducting tape, and the highest practical temperature at which the attachment is completed. The strained strips, upon attachment and release from back-tension on the payoff side, then contract axially and place the superconductor core into axially compressive strained state. The greater the axially compressive strain the larger the axial tensile strain that can be supported by the reinforced superconductor before its tensile stress tolerance limit is reached. A sufficiently high CTE enhances this effect upon cool down from the attachment temperature to the cryogenic operating temperature. A higher attachment temperature also enhances the effect by allowing for a greater temperature range over which the CTE can contract and place the superconductor into a greater axially compressive state.

It should be noted however that too large of a CTE, tension or modulus in the lamination strip can also place too much axial compressive strain into the superconductor right after attachment of the strip and before cool-down, and result in current density degradation. For this reason, a very high modulus material, low CTE material like Tungsten (400 GPa, 5 ppm m/m/k) will not provide the improvements described herein. Conversely, a very high CTE, low modulus material like Zn will not provide the improvements described herein.

The direct role of the elastic modulus in improving tensile stress tolerance is two-fold. First, upon attachment and release, the contraction strain of the reinforced tape to internal equilibrium is increased and secondly, the reinforced tape modulus is increased by a larger strip modulus as described in NPD 1, so that a greater tensile load and stress is required to strain the tape to its tensile strain limit.

The critical architectural feature, and the one that greatly improves the utility of reinforced superconductors, is the ratio of reinforcement cross-sectional area to conductor cross-sectional area that is required to attain a required level of stress tolerance improvement. The higher the elastic modulus of the strip, the less of it is required for the reinforced tape to support the same tensile stress tensile stress. The embodiments provide for much greater tensile stress tolerance at reinforcement area fractions below 35% than what can and has been attained with state of the art stainless steel.

Specific embodiments of the invention consist of a reinforced BSSCO 2223 composite tape, or an YBSCO based ($YBa_2Cu_3O_y$ superconductor) with superior stress tolerance using a reinforcement strip with attributes exceeding specific minimum levels and that is attached to the BSCCO 2223/silver tape or the YBCO-metal substrate tape.

Embodiments described herein identify the convergence of architecture, material attributes and process conditions for attaining greatly superior stress tolerance over the current state of the art, and the application of the very few practical reinforcement materials that meet these requirements sufficiently to produce a reinforced superconductor with demonstrated stress tolerances exceeding by at least 10% and up to 60%, the best axial stress tolerance attained with current state of the art stainless steel reinforcement.

In specific embodiments a method is described for producing a reinforced superconducting tape as described in any embodiment provided herein wherein stress tolerance of embodiments provided exceeds by at least about 10% to about 60% to a superconducting tape reinforced with hard stainless steel; wherein a calculation is performed and a material is considered acceptable if the level is between these percentages of about 10 to about 60 percent, and the material is not acceptable if this percentage range is not reached. The comparison can be to a sampled superconducting material reinforced with stainless steel or another standard known in the art or a comparison can be made to a known standard (or from a database) accessed by a computer driven by a user/or performed automatically.

Specific, significant factors considered in specific embodiments described herein in the direction of the longitudinal strip axis include 1) modulus of elasticity 2) coefficient of thermal expansion (CTE), 3) yield onset strain (defined here as the proportionality limit) that sets the maximum tension in the strips during attachment and 4) lamination tension applied when the strips are solder-attached to the superconducting oxide-metal base composite tape. A fifth, reinforcement thickness or more generally, increased reinforcement cross sectional area fraction, also improves stress tolerance. However increased area fraction (attained by increased thickness in the case of a typical reinforcement strip approach), negatively impacts the trade-off between critical current density and strengthening, and the invention teaches a method for decreasing the required amount of reinforcement, and thereby increasing the operating current density of the conductor. In specific embodiments and through analysis, the effects of attributes 1-5 on stress tolerance above are calculated for an added reinforcement material and a combined set of threshold levels are defined, which if met yield a product that is considered acceptable and if not, the product is considered not acceptable with regards to its stress tolerance and current density.

<Tensile Properties of Superconducting Oxides and Composites>

Superconducting oxides are ceramics that support very little or no appreciable plastic deformation. In tension they elongate elastically until they fracture at a critical strain level. The mechanical properties of fine free standing filaments comprised of for example the BSCCO 2223 phase are not well known, because they are not readily manufactured in that form. However, as axial tension is applied to the common multifilament composite BSCCCO 2223/silver tape form, the low modulus silver alloy matrix in the tape transitions to plastic deformation mode at very low strain levels (about 0.1%) due to the high degree of annealing imparted by the high reaction and sintering temperatures (about 800 to about 850° C.) required to form high current density 2223. Critical current typically starts to degrade at around 0.2-0.3% tensile strain and stress levels below 130 MPa, limiting the use of these tapes in many mechanically more demanding applications. It is of great benefit to increase the critical strain and stress at which critical current starts to decrease due the onset of BSCCO 2223 filament fracture.

Figure 3:
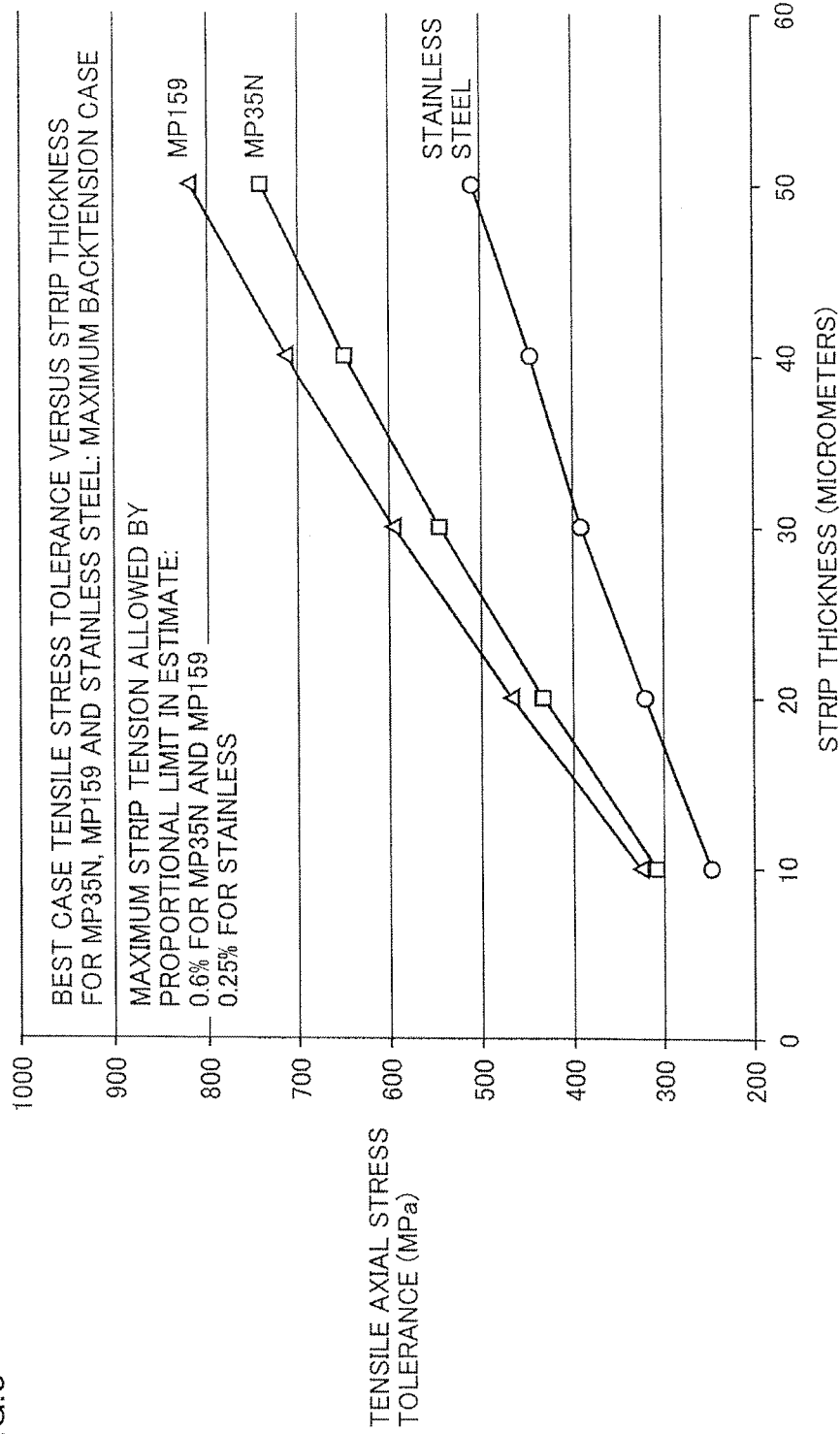
FIG. 3 is a graph showing a relationship between a tensile stress tolerance and a strip thickness.

Application of reinforcement to improve upon these properties has been the subject of considerable development work and investment over about the past 25 years. The common method applies a thin strip of metal to each side of the HTS tape by passing the 2 solder-wetted strips and the BSCCO/silver tape pressed together through a solder bath, followed by solidification (refer to FIGS. 3 and 17). FIG. 3 illustrates best case stress tolerance using the materials (MP35N(registered trademark) and MP159(registered trademark)) and methods of embodiments of this invention, compared the best that can be attained with state of the art stainless steel, illustrating that stress tolerance is improved by about 25% to 60% depending on strip thickness and combination of strip properties. In commercial production the realized stress tolerances may typically be 10 to 20% lower than these values due to variability in process conditions and material properties. The state of the art has produced stainless steel reinforcement as the best approach for achieving practical stress tolerance improvements, while adding the least amount of reinforcement material to the cross section (refer to PTDs 1 to 5).

In the following conceptual reduction to practice, stainless steel, the current state of the art for reinforcing BSCCO 2223 tapes, is used as the baseline for comparison.

<Practical Reinforcement Materials for Exceeding State of the Art Stainless>

Engineering materials with high CTE typically exhibit low modulus and materials with high modulus exhibit very low CTE 508. Very few available engineering materials that are compatible with the other requirements of an HTS reinforcement material provide both acceptably high modulus and CTE. This CTE must typically exceed about 11 ppm (m/m/K) average from the solidification temperature of the solder lamination to the cryogenic operating temperature, with a modulus above about 205 GPa, and a proportionality strain limit of about 0.4% or greater. No suitable, practical material was found for a considerable period of time during an initial search for a material that could meet these criteria.

A figure of merit (FOM) approach was ultimately used to help identify suitable classes of practical materials, by multiplying together the modulus, the CTE and the proportionality limit strain. Whereas stainless steel typically tops out at FOM values in the 750-950% GPa/K range, the FOM for attaining 400 MPa stress tolerance levels with required small area fraction additions of reinforcement should exceed about 950%/GPa/K.

It was discovered that a class of alloys containing Cobalt (Co), Chromium (Cr) and Nickel (Ni) in excess of 30 wt %, 15 wt % and 14 wt % respectively, with very specific processing, can meet the above described requirements. The best among these are alloys designated as MP159 and MP35N(registered trademark), alloy formulations from SPS Technologies, Inc.

Estimates showed that optimally applied forms of these alloys, provide about 20% to 60% improvement in axial stress tolerance than the best that could be attained with stainless steel over a strip thickness range of 0.01 to 0.05 mm, as illustrated in FIG. 3.

Between these two alloys, MP35N(registered trademark) is already available in a thicker sheet form, while MP159 requires somewhat more development to produce sheet forms. As a result MP35N(registered trademark) was selected for test production of reinforced BSCCO 2223/silver tape. Other alloys described above are understood to be satisfactory.

Specific embodiments described herein and used with any other aspect of the invention described herein include; providing for a reinforcement strip containing at least Co>30 wt %, Cr>15 wt % and Ni>14%; providing a non magnetic reinforcement strip; providing reinforcing material comprised of commercial alloys MP159(registered trademark), MP35N(registered trademark), Elgiloy(registered trademark), and similar commercial formulations; with a proportionality limit in excess of 0.4%, yield stress in excess of 1 GPa, UTS in excess of 1.6 GPa and elastic modulus in excess of 205 GPa; providing a BSCCO 2223/silver tape reinforced with commercial alloys MP159, MP35N(registered trademark), Elgiloy, and similar commercial formulations, with the reinforced composite exhibiting less than 5% Ic degradation while supporting an axial tensile stress in excess of 400 MPa; providing an application of axial tensile stress and strain to the reinforcement during attachment or incorporation into the composite to a level exceeding 50% of the proportionality limit stress and strain of the reinforcement, and with the reinforcement material meeting one or more criteria described herein; providing one or more materials described herein with added surface material to a thickness of 10 micrometer or less, that enhances solder wetting, including for example copper, tin, and alloys containing these elements.

Certain alloys based on the metal Beryllium also meet the above described threshold levels. However Be is expensive, generally not available in long thin strip form, and it is toxic.

Now, a configuration of the reinforced superconducting tape according to one embodiment of the present invention will be described with reference to FIG. 1. Referring to FIG. 1, reinforced superconducting tape 1 mainly includes superconducting tape portion 1020, reinforcement member 1030 and a joining material 1040. Reinforcement member 1030 is fixed to superconducting tape portion 1020 by joining material 1040. Superconducting tape portion 1020 is a tape-like superconducting wire and includes, for example, a bismuth-based superconducting conductor. Reinforcement member 1030 is arranged to overlap with a main surface (a surface portion having a relatively large area) of superconducting tape portion 1020. Reinforcement member 1030 and superconducting tape portion 1020 both have a tape-like shape. Joining material 1040 is formed to extend to the main surface of superconducting tape portion 1020 and an end face connecting to this main surface. Reinforcement member 1030 is made of a material including nickel, cobalt and chromium. For example, the nickel is in a range from 20 wt % or more to 42 wt % or less, the cobalt is in a range from 23 wt % or more to 44 wt % or less, and the chromium is in a range from 14 wt % or more to 26 wt % or less. By using such reinforcement member 1030, there can be obtained reinforced superconducting tape 1 with increased tensile strength as compared with that of the conventional superconducting tape.

A composite member including a main body portion (main body portion made of the aforementioned material including nickel, cobalt and chromium) and a surface-treated layer formed on a surface of the main body portion may be used as reinforcement member 1030. As the surface-treated layer, a layer made of a material having more excellent wettability of joining material 1040 than that of the aforementioned main body portion may be formed in order to, for example, increase the joining strength with joining material 1040. When solder is used as joining material 1040, for example, a plated layer (such as, by way of example, a copper (Cu)-plated layer, or a stacked film including a nickel (Ni) underlying layer and a tin (Sn)-plated layer formed on the Ni underlying layer) may be formed as the surface-treated layer. Although the surface-treated layer may be formed to cover the entire surface of the main body portion, the surface-treated layer may at least be formed on a surface portion of reinforcement member 1030 that is in contact with joining material 1040. For example, in FIG. 1, the surface-treated layer may be formed on the surface portion of reinforcement member 1030 that faces joining material 1040. The aforementioned surface-treated layer is not limited to the aforementioned plated layer as long as it can increase the joining strength with joining material 1040, and the surface-treated layer may be a layer formed by other treatment (e.g., a surface layer of the main body portion obtained by removing an oxide film and the like by plasma etching and the like).

Figure 2:
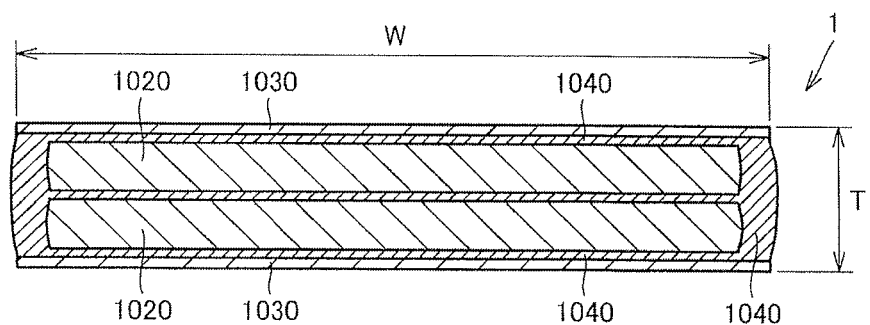
FIG. 2 is a schematic cross-sectional view of another example of the reinforced superconducting tape according to the aspect of the present invention.

A configuration of another example of the reinforced superconducting tape according to the embodiment of the present invention will be described with reference to FIG. 2. Referring to FIG. 2, reinforced superconducting tape 1 basically includes the configuration similar to that of reinforced superconducting tape 1 shown in FIG. 1. However, reinforced superconducting tape 1 is different from reinforced superconducting tape 1 shown in FIG. 1 in that two superconducting tape portions 1020 are stacked and arranged. In this case as well, the effect similar to that produced by the superconducting tape shown in FIG. 1 can be obtained. In addition, an amount of current that can flow through one reinforced superconducting tape 1 can be increased because two superconducting tape portions 1020 are stacked.

MP35N(registered trademark) and MP159(registered trademark) can, for example, be used as the material of reinforcement member 1030 (material of the main body portion when reinforcement member 1030 is the composite member as described above) in aforementioned reinforced superconducting tape 1. As shown in FIG. 3, these materials are more excellent in tensile axial stress tolerance than stainless steel conventionally used as the material of reinforcement member 1030. In FIG. 3, the horizontal axis indicates a thickness (unit: mm) of the reinforcement member, and the vertical axis indicates a tensile axial stress tolerance (unit: MPa).

Figure 4:
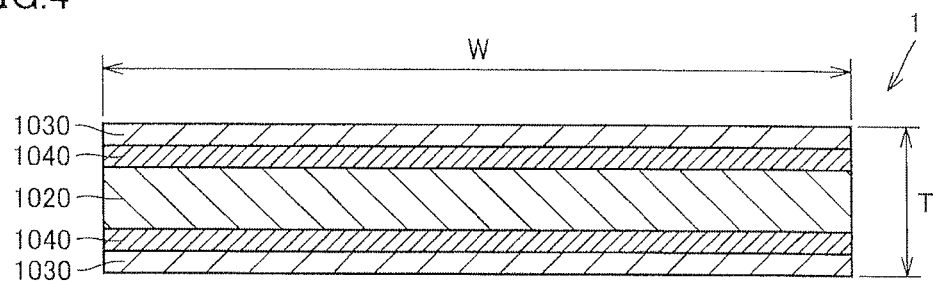
FIG. 4 is a schematic cross-sectional view of a reinforced superconducting tape according to an aspect of the present invention.
Figure 5:
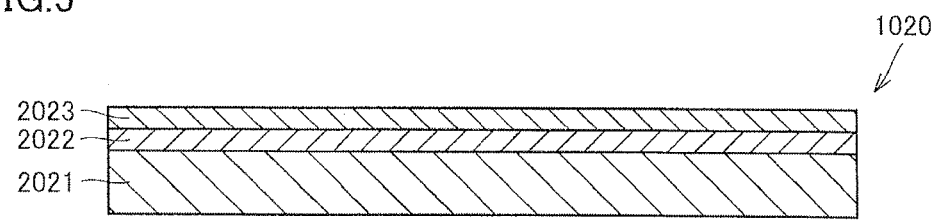
FIG. 5 is a schematic cross-sectional view for describing a configuration of a superconducting tape portion forming the reinforced superconducting tape shown in FIG. 4.

A configuration of another example of the reinforced superconducting tape according to the embodiment of the present invention will be described with reference to FIG. 4. Referring to FIG. 4, reinforced superconducting tape 1 basically includes the configuration similar to that of reinforced superconducting tape 1 shown in FIG. 1, while superconducting tape portion 1020 includes an yttrium-based superconducting conductor. As shown in FIG. 5, superconducting tape portion 1020 in FIG. 4 mainly includes an oriented substrate 2021, a superconductor layer 2022 and a stabilized layer 2023. A protective layer may be formed on stabilized layer 2023.

An oriented substrate having an intermediate layer provided on a metal substrate material is preferably used as oriented substrate 2021. An oriented metal substrate biaxially-oriented with respect to the c axis can be used as the metal substrate material. An IBAD substrate material, an Ni—W alloy substrate material, a clad-type metal substrate material using SUS and the like as a base metal, and the like can, for example, be used as the metal substrate material. Stabilized zirconia such as $CeO_2$ or YSZ, $Y_2O_3$ and the like can be generally used as the intermediate layer, and $CeO_2$ is used for the uppermost layer (surface layer on the superconductor layer 2023 side) because the lattice matching and the critical current density (Jc) can be enhanced.

RE123-based oxide superconductor can, for example, be used as superconductor layer 2022. Yttrium (Y), Gadolinium (Gd), holmium (Ho), samarium (Sm) or the like is preferably used as RE. A vapor phase method such as a coating pyrolysis method (MOD method) and a PLD method can, for example, be used as a method for forming superconductor layer 2020 formed of an oxide superconductor.

Silver (Ag) or a silver alloy can, for example, be used as stabilized layer 2023. A thickness of stabilized layer 2023 can, for example, be 10 nm or larger and 5 mm or smaller.

A metal layer including copper (Cu), nickel (Ni) or an alloy of these can, for example, be used as the aforementioned protective layer formed on stabilized layer 2023. The protective layer preferably has sufficient wettability with the solder serving as joining material 1040. The aforementioned metal does not cause a problem that the metal reacts with the solder and creates a void even when the metal comes into contact with the solder. Therefore, it is possible to reduce occurrence of a problem such as peel-off of reinforcement member 1030 even when force is applied in the thickness direction of superconducting tape portion 1020.

In reinforced superconducting tape 1 shown in FIG. 4, a ratio of a cross sectional area of reinforcement member 1030 to a total cross sectional area of superconducting tape 1 may be 80% or less. In this case, it is possible to reduce occurrence of the problem that an amount of flowing current per unit cross sectional area in reinforced superconducting tape 1 becomes excessively small.

Figure 6:
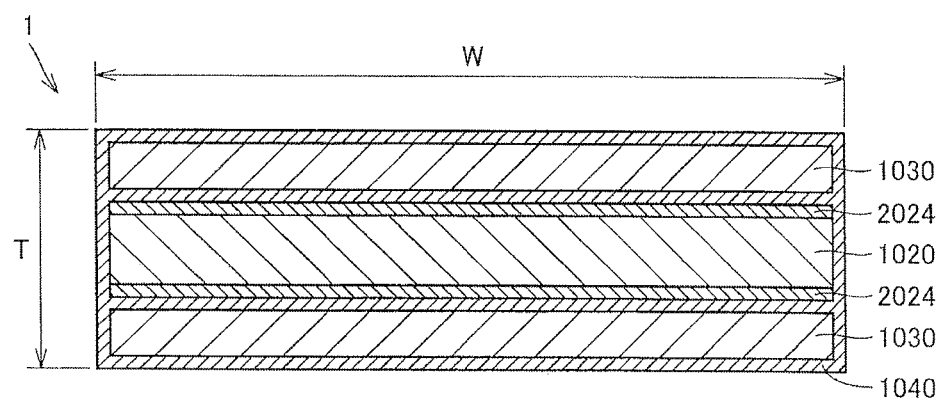
FIG. 6 is a schematic cross-sectional view of another example of the reinforced superconducting tape according to the aspect of the present invention.

A configuration of a modification of another example of the reinforced superconducting tape according to the embodiment of the present invention will be described with reference to FIG. 6. Referring to FIG. 6, reinforced superconducting tape 1 basically includes the configuration similar to that of reinforced superconducting tape 1 shown in FIGS. 4 and 5. However, reinforced superconducting tape 1 is different from reinforced superconducting tape 1 shown in FIGS. 4 and 5 in that protective layers 2024 are formed on a front surface and a rear surface of superconducting tape portion 1020 that face reinforcement members 1030. The aforementioned metal layer including Cu, Ni or an alloy of these can be used as protective layer 2024. A set of reinforcement members 1030 are arranged to sandwich superconducting tape portion 1020. By joining material 1040 made of solder, reinforcement member 1030 is bonded to superconducting tape portion 1020 with protective layer 2024 interposed therebetween.

As shown in FIG. 6, joining material 1040 is provided between reinforcement member 1030 and superconducting tape portion 1020. However, joining material 1040 may be formed to cover the entire surface of reinforcement member 1030 (i.e., to extend from the surface of reinforcement member 1030 and cover a side surface of protective layer 2024 and a side surface of superconducting tape portion 1020). In this case, peel-off of reinforcement member 1030 can be prevented.

In reinforced superconducting tape 1 shown in FIGS. 1, 2 and 4 to 6, a compressive stress is preferably applied to superconducting tape portion 1020 in the extending direction of superconducting tape portion 1020. In this case, the aforementioned compressive stress serves as a resistance component to a tensile stress applied to reinforced superconducting tape 1. Therefore, higher critical tensile stress in reinforced superconducting tape 1 can be achieved, than the case of not applying the aforementioned compressive stress to superconducting tape portion 1020. This application of the compressive stress can be achieved by applying a tensile stress to reinforcement member 1030 when reinforcement member 1030 is connected to superconducting tape portion 1020.

In addition, in reinforced superconducting tape 1 shown in FIGS. 2 and 4 to 6, the aforementioned composite member including the main body portion and the surface-treated layer may be used as reinforcement member 1030.

EXAMPLES

The present invention will be better understood by reference to the following examples which are offered by way of illustration not limitation. Examples are provided below.

Example 1

<Processing Steps and Experimental Results>

This example provides further details regarding the processing steps and experimental results obtained according to various embodiments. In the description provided, DI-BSCCO refers generally to all superconducting tapes containing BSCCO 2223 that are manufactured by Sumitomo Electric Industries, while Type H, type HT-SS, and type HT-CA are DI-BSCCO tapes comprised of BSCCO 2223/silver, BSCCO 2223/silver with two laminated strips of stainless steel, and BSCCO 2223/silver with two laminated copper alloys strips respectively. The term HT refers to a lamination reinforced embodiment.

Figure 7:
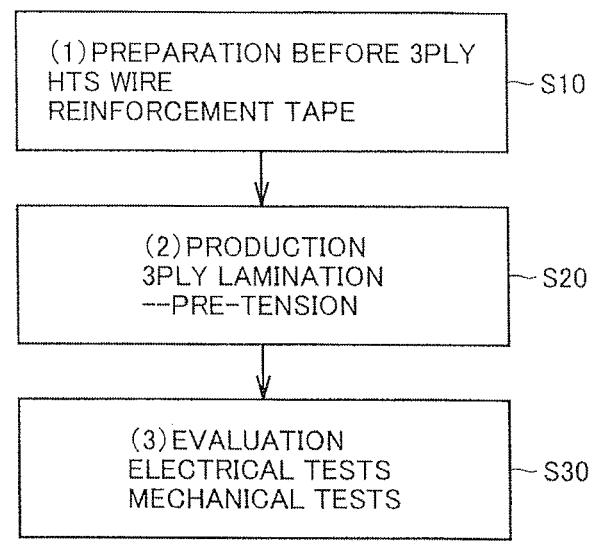
FIG. 7 is a flowchart for describing a method for manufacturing the reinforced superconducting tape according to the aspect of the present invention.
Figure 8:
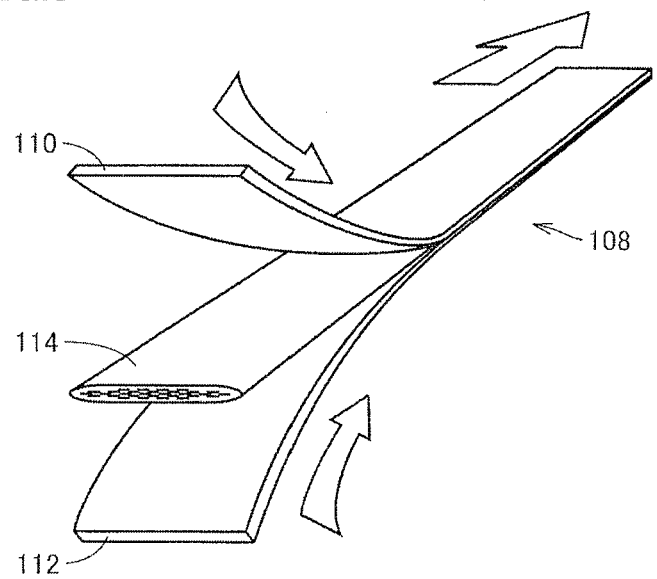
FIG. 8 is a schematic view for describing the method for manufacturing the reinforced superconducting tape shown in FIG. 7.

FIG. 7 and FIG. 8 illustrate certain processing steps for producing reinforced HTS tape, according to an embodiment. The processing involves three stages: preparation (S10), production (S20), and evaluation (S30). In the preparation (S10) stage, Type H tape and reinforcing (metallic) tape strips are separately prepared. In the production (S20) stage, a three-ply structure 108 is generated wherein the Type H HTS tape 114 is sandwiched between two thin films (tapes) of the reinforcing tape under tension and high temperatures. In the evaluation (S30) phase, the resulting structure is tested to determine its electrical and mechanical properties.

As shown in FIG. 8 the three ply laminated structure 108 comprises an upper thin layer of reinforcement tape 110, a lower thin layer of reinforcement tape 112, and a thin layer of Type-H HTS tape 114 forming a sandwich structure. The tape material (the thin layer of Type-H HTS tape 114) can include a superconducting material such as BCSCO or other HTS material. In an embodiment, the BSCCO 2223 is surrounded by an Ag-alloy (as described elsewhere). The structure 108 is generated by drawing the three components (the upper thin layer of reinforcement tape 110, the lower thin layer of reinforcement tape 112, and the thin layer of Type-H HTS tape 114) through a solder bath under tension and high temperature. When the structure 108 cools it contracts leaving a composite material that is under compressive residual stress. This residual stress is a desirable feature of the structure that allows it to withstand tensile loads.

A photographic image of a cross-section of the resulting structure 108 is also shown in FIG. 9. The BSCCO 2223 or other HTS material 121 is surrounded by a layer of Ag-alloy 122 and reinforced and contained by the reinforcing tape (reinforcement member 1030). The material chosen for reinforcement plays a key role in determining the reinforced tape tensile strength. Using conventional materials (e.g., stainless steel) tensile strengths as high as 270 MPa have been achieved. According to an embodiment, however, using a NiCoCr alloy (e.g., MP35N described below) as the reinforcing material leads to a dramatic increase of the tensile strength of the resulting structure 108. According to an embodiment, tensile strengths as high as 537 MPa have been achieved.

Figure 10:
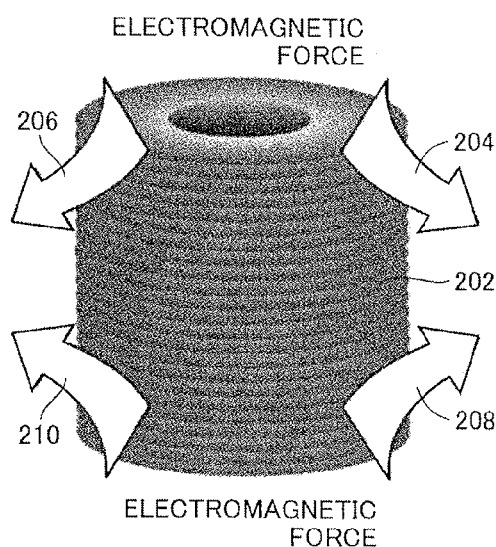
FIG. 10 is a schematic view showing a coil using the reinforced superconducting tape according to the aspect of the present invention.

FIG. 10 illustrates the utility of HTS tape with improved tensile stress tolerance and the motivation for seeking reinforcement materials that provide for increased tensile strength. A magnetic field is generated by an electrical current flowing through a wire. In magnet applications a structure 202 is formed in which many wires are wrapped around a spool or similar object. The magnetic field strength that results depends on the number of times the wire is wound. The electrical currents flowing in the wires interact with the magnetic field and stresses 204, 206, 208, 210 are induced due to the Lorentz force. As currents are increased, stresses are increased. Presently, according to an embodiment, superconducting critical currents as large as 200 A in DI-BSCCO wires as long as 1 km have been achieved. In high-field magnet applications, it is desirable for superconducting wires and tapes to maintain critical currents in the presence of high magnetic fields. In such applications, hoop stresses of more than 400 MPa can arise. For this reason, DI-BSCCO tapes have not been widely used in the magnetic coil market to date due to the fact that conventional DI-BSCCO tapes could not withstand the high electromagnetically induced stresses. Progress toward achievement of higher critical currents and larger tensile strengths has been achieved according to disclosed embodiments.

Table 1 compares performance characteristics of several superconducting tapes according to a conventional approach.

TABLE 1

| | Wire Type (in production) | | |
| --- | --- | --- | --- |
| | Type H | Type HT-SS | Type HT-CA |
| Reinforcement tape | — | Stainless Steel | Copper Alloy |
| Ic (77K, Self-Field) | 170 A-200 A | 170 A-200 A | 170 A-200 A |
| Ic (4.2K, 17T) | 300 A | 300 A | 300 A |
| Critical Tensile Stress (77K)* | 130 MPa | 270 MPa | 250 MPa |
| Je (4.2K, 17T) | 303 A/mm$^2$ | 240 A/mm$^2$ | 195 A/mm$^2$ |

*defined where 95% of Ic retention was confirmed

The critical tensile stress is defined in terms of the way the current flowing in the tape responds to an applied stress. As an increasing tensile stress is applied to a tape, the current flowing in the tape begins to decrease at some value of the applied stress. The critical stress is defined to be the value of stress at which the current has decreased to 95% of its maximum (critical) value. Three tape types are summarized in Table 1: type H, type HT-SS, and type HT-CA. The first of these, type H, represents the non-reinforced superconducting tape. The second, type HT-SS, has reinforcement tape made of stainless steel and the third, type HT-CA, is reinforced with a copper alloy. All three exhibit similar values for the critical current. The one with the highest critical stress 270 MPa, however, is the type HT-SS wire that is reinforced with stainless steel reinforcement tape. This value, however, falls short of the goal of achieving tensile stress above 500 MPa, or even 400 MPa. Also, another disadvantage relates to the values of the engineering current density. The inclusion of the reinforcement tape increases the overall wire cross section without increasing the total current. The net result is a reduction of the engineering current density relative to the Type H that is not reinforced. Thus, there is a need for further improvement in both tensile stress and engineering current density.

Figure 11:
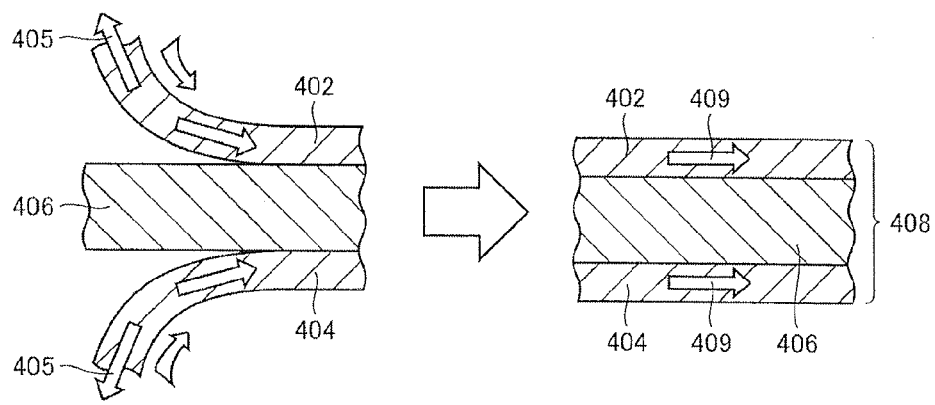
FIG. 11 is a schematic view for describing the method for manufacturing the reinforced superconducting tape according to the aspect of the present invention.
Figure 12:
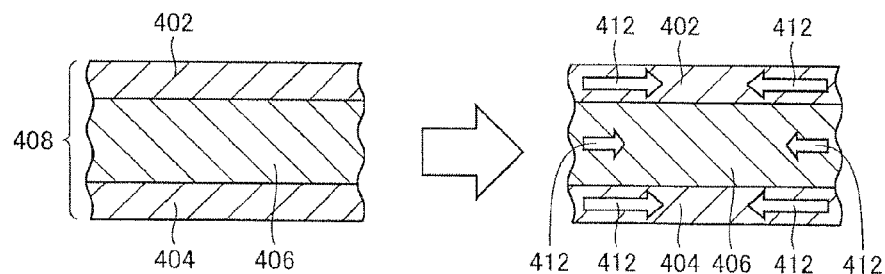
FIG. 12 is a schematic view for describing an effect of the reinforced superconducting tape according to the aspect of the present invention.

FIG. 11 and FIG. 12 illustrate the interplay between the thickness, modulus, and yield stress of the reinforcement material as they relate to the generation of composite structures having increased tensile strength. FIG. 11 and FIG. 12 illustrate processing detail for introducing the high levels of pre-tension in the two reinforcement strips and the effect of thermal mismatch on the internal strain and stress state of the reinforced tape. The reinforcement tape 402, 404 is placed under tension 405 before it is bonded to the superconducting film (superconducting tape portion 406). The bonding process occurs by drawing the composite structure through a solder bath under high temperature. The structure becomes bonded as a result of contact with the solder as it solidifies. Once bonded, the applied tension is released. The resulting structure 408 therefore acquires a compressive residual stresses 409 when the pre-tension of the reinforcement film is released.

The thickness, modulus and yield stress determine how much pre-tension can be placed on the reinforcing tape before bonding. The reinforcement tape 402, 404 is chosen to have the largest possible value of the modulus and yield stress. In addition, a larger value for the thermal expansion coefficient is desirable. This is because as the structure 408 cools residual compressive thermal stresses 412 develop. It is desirable to have the largest possible compressive stress in the resulting film because the superconducting (e.g., BSCCO) material is generally brittle and does not support tensile stresses. There is a performance tradeoff related to the thickness of the reinforcing material. Greater thickness induces greater residual stresses but has the drawback of increasing the cross-sectional area of the structure leading to reduced engineering current density. Thus, materials having the largest values of modulus, yield stress, and thermal expansion coefficient in combination provide the best reinforcing materials because they can induce a given residual stress with a thinner reinforcing layer than would materials having lower values of these parameters.

Figure 13:
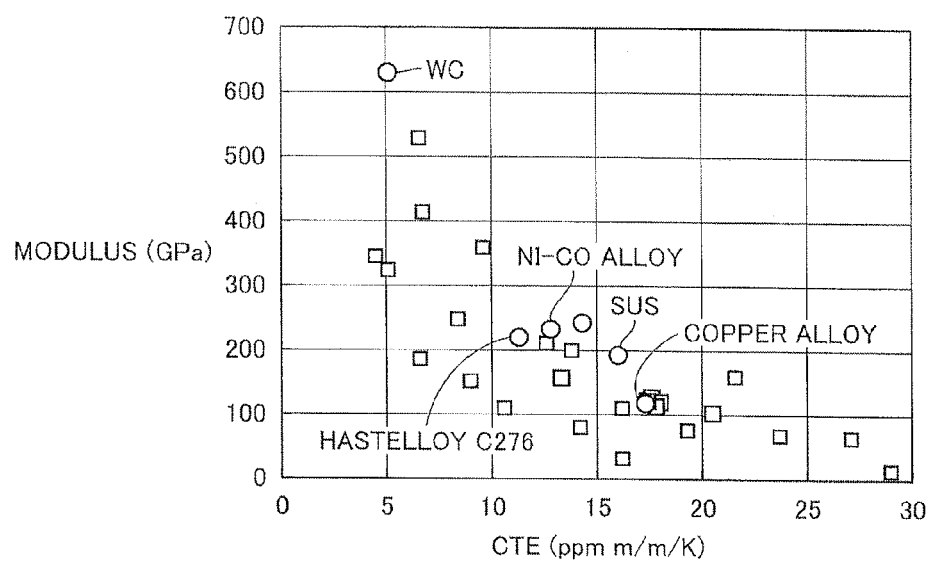
FIG. 13 is a graph showing a relationship between CTE and a modulus of a metal material.

FIG. 13 illustrates the inverse relationship between CTE and elastic modulus, and the region where relatively high values of each provide for modest improvements over stainless steel, which then coupled with higher yield stress and strain than stainless provide for the large and useful improvement required and realized with a very select few available materials, in this case, commercial Co—Ni—Cr alloys known as MP35N and MP159. FIG. 13 illustrates a comparison of various materials that were considered in developing the higher tensile strength materials of the disclosed embodiments. In FIG. 13, the horizontal axis indicates CTE (unit: ppm m/m/k) and the vertical axis indicates a modulus (unit: GPa). A figure of merit was defined to be the product of the modulus, the coefficient of thermal expansion, and the yield stress. Two promising materials are the alloys: MP35N and MP159 (compositions given below). As seen in table 2 both of these materials outperform stainless steel 304 and the copper alloy in terms of their modulus 504 and yield stress 506 but have lower coefficients of thermal expansion 507.

TABLE 2

| Material | CTE | Modulus | Yield Stress |
|---|---|---|---|
| MP35N | 12.8 | 232 GPa | 1800 MPa |
| MP159 | 14.3 | 222 GPa | 1800 MPa |
| Stainless Steel 304 | 16.0 | 180 GPa | 1200 MPa |
| Copper alloy | 17.3 | 136 GPa | 500 MPa |

CTE: Coefficient of Thermal Expansion

The figure of merit approach described previously is useful because it is the product of three factors that should be maximized in one material in order to obtain the desired result of a thin reinforcing material that can impart the greatest residual stress to the resulting composite. FIG. 13 illustrates the notion that there tends to be a tradeoff between high modulus and high coefficient of thermal expansion and that the optimum material is not the one with the maximum of either the modulus or coefficient of thermal expansion.

Table 3 presents the alloy compositions for the selected materials MP35N and MP159. Table 4 presents the composition of the conventionally used stainless steel.

TABLE 3

Composition of Ni—Co alloys

| Element | MP35N | MP159 |
|---|---|---|
| Ni | 35 | BAL |
| Co | BAL | 36 |

TABLE 3-continued

Composition of Ni—Co alloys

| Element | MP35N | MP159 |
|---|---|---|
| Cr | 20 | 19 |
| Mo | 10 | 7 |
| Ti | 1 | 2.9 |
| Al | — | 0.2 |
| Nb | — | 0.5 |
| Fe | 1 max | 9 |
| C | 0.025 max | 0.04 max |
| B | 0.01 max | 0.03 max |

TABLE 4

Composition of Stainless steel 304

| Element | Stainless Steel 304 |
|---|---|
| Ni | 8-10.5 |
| Co | — |
| Cr | 18-20 |
| Mo | — |
| Ti | — |
| Al | — |
| Nb | — |
| Fe | BAL |
| C | 0.08 max |
| B | — |
| Si | 1 max |
| Mn | 2 max |
| P | 0.05 max |
| S | 0.03 max | from JIS G 0321
(JIS: Japanese Industrial Standards)

Unlike stainless steel, the alloys MP35N and MP159 contain an appreciable fraction of cobalt with Ni/Co/Cr being the dominant elements. The composition of another candidate reinforcing material is presented in FIG. A-7. This alloy is a Ni/Co/Cr "super-alloy" that goes by the commercial name "Elgiloy." Elgiloy (Co—Cr—Ni Alloy) is a "super-alloy" consisting of 39-41% Cobalt, 9-21% Chromium, 14-16% Nickel, 11.3-20.5% Iron, 6-8% Molybdenum, and 1.5-2.5% Manganese. It is used to make springs that are corrosion resistant and exhibit high strength, ductility, and good fatigue life. Elgiloy specifications: AMS 5876, AMS 5833, UNS 30003.

Figure 14:
FIG. 14 is a photograph of a cross section of one example of the superconducting tape.
Figure 15:
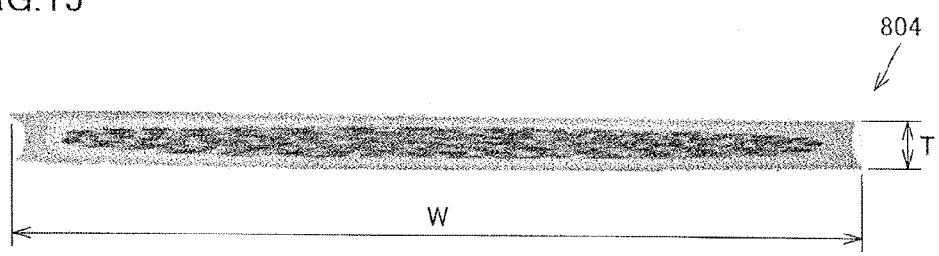
FIG. 15 is a photograph of a cross section of one example of a superconducting tape reinforced with stainless steel.
Figure 16:
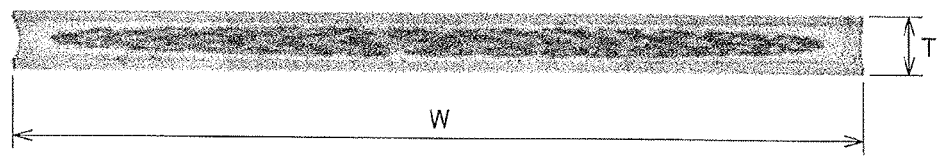
FIG. 16 is a photograph of a cross section of one example of a superconducting tape reinforced with a copper alloy.
Figure 17:
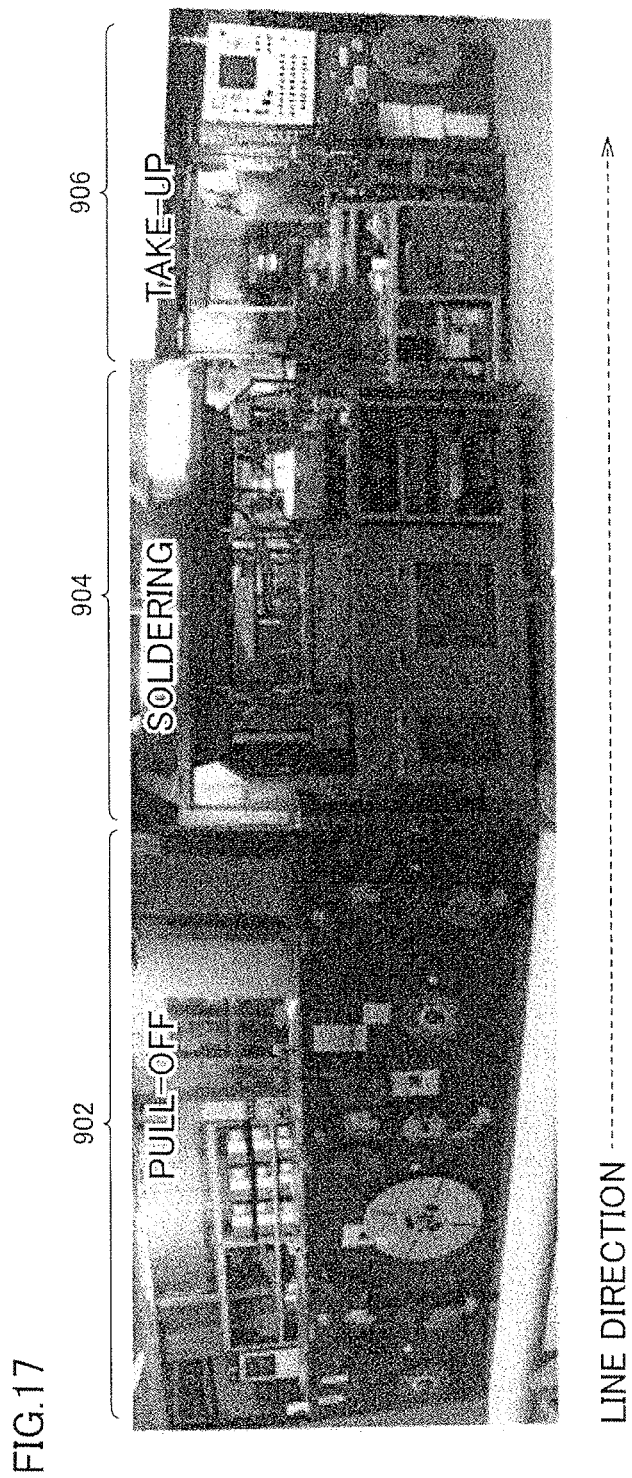
FIG. 17 is a photograph of a machine for manufacturing the reinforced superconducting tape according to the aspect of the present invention.

FIGS. 14-16 illustrate a number of candidate HTS tapes that were fabricated and tested. Each was produced according to the processing steps described with respect to FIG. 7 and FIG. 8. The systems include: a bare, type-H, HTS tape 802 in FIG. 14, a type HT-SS, stainless steel reinforced tape 804 in FIG. 15, a type HT-CA copper alloy reinforced tape 806 in FIG. 16, and a new reinforced HTS tape 1 in FIG. 9, called Type-XX, that is reinforced with the superior alloy MP35N. These were manufactured at facilities of Sumitomo Electric shown in FIG. 17. FIG. 17 illustrates the lamination machine employed to produce lamination reinforced HTS tapes. As indicated, the three-ply lamination machine includes three sections: a pull-off section 902, a soldering section 904, and a take up section 906. The pull-off section 902 applies tension to the tape 406 and reinforcement tapes 402, 404 (see FIG. 11). In disclosed experiments, a maximum tension per lamination strip tape of 200N was applied. The tension was controlled by a dancer roll and weight. The three-ply structure is fused under tension and high temperature in a solder bath in the soldering section 904 and the resulting composite structure is cooled and received in the take up section 906. The soldering section uses a flow soldering technique with lead-free solder.

Figure 18:
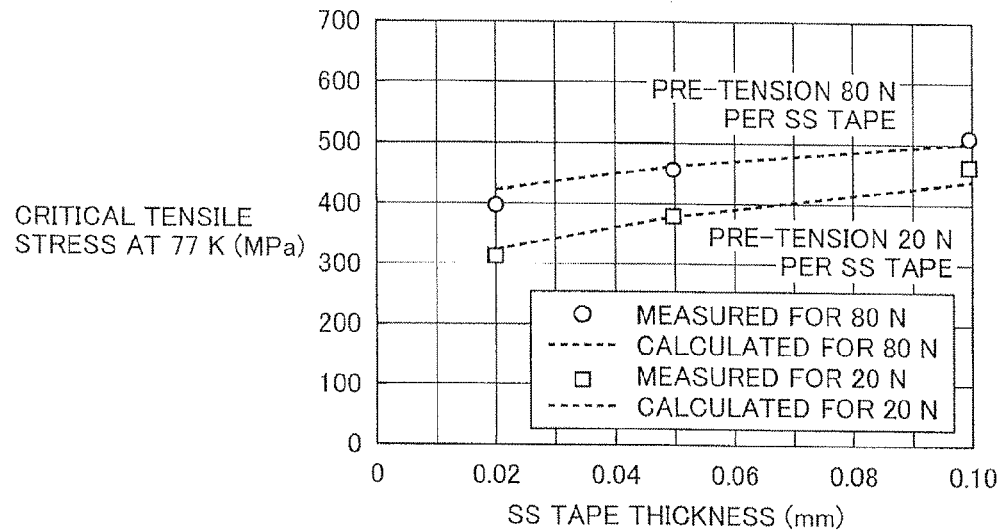
FIG. 18 is a graph showing a relationship between a critical tensile stress and a thickness of a reinforcement member.

FIG. 18 illustrates the results of electrical and mechanical testing of the type HT-SS systems with regard to pre-tension and thickness of the reinforcing tapes. In the graph of FIG. 18, the horizontal axis indicates a thickness (unit: mm) of the stainless steel tape and the vertical axis indicates a critical tensile strength (unit: MPa) at 77 K. Each system includes Type H tape sandwiched between stainless steel tapes of various thicknesses. The goal was to produce a composite structure having a critical tensile strength greater than or equal to 500 MPa, but the minimum acceptable threshold for utility is 400 MPa. This goal was realized by choosing a sufficiently thick stainless steel reinforcement tape. However, the resulting engineering current density was found to be unacceptably low, as described in the following.

Three thicknesses were considered: 0.02 mm, 0.05 mm and 0.1 mm, and for each of these thicknesses, tapes were produced using two values of pre-tension: 80N and 20N, to give six different reinforced tape types. For each of these types, the critical tensile strength was measured. The results are shown as a plot of tensile strength vs. tape thickness in FIG. 18. These results show that the tensile strength of a given system is an increasing function of both the thickness and the pre-tension value. Those systems generated with 80N pre-tension have higher critical tensile strength than those generated using a pre-tension value of 20N.

Figure 19:
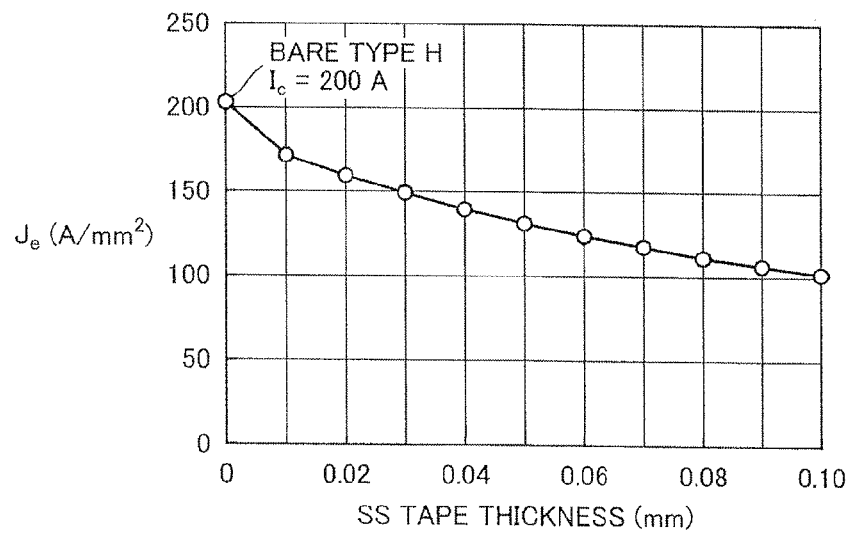
FIG. 19 is a graph showing a relationship between a maximum engineering current density (Je) and a thickness of the reinforcement member.

The deleterious effect of thicker reinforcement on the engineering current density is shown as a plot of current density vs. tape thickness in FIG. 19. In FIG. 19, the horizontal axis indicates a thickness (unit: mm) of the stainless steel tape and the vertical axis indicates an engineering current density Je (unit: A/mm$^2$). Thicker reinforcing tapes have lower values of the engineering current density because, while the overall thickness of the wire increases with increasing thickness of the reinforcing tape, the area of the current carrying superconducting section remains constant. As can be seen from FIG. 19, the engineering current density of the 0.1 mm wire is 50% lower than the current density that could be carried by a bare type-H tape (i.e., a superconducting BSCCO 2223 silver tape with no reinforcement). Thus, although tapes exhibiting critical tensile strengths greater than 500 MPa can be achieved with stainless steel, such tapes have engineering current densities that are unacceptably too low. This fact underscores the need for reinforcing materials having high modulus, coefficient of thermal expansion, and yield stress, so that high critical tensile stress can be achieved with sufficiently thin reinforcing strips so that engineering current density is sufficiently high.

Figure 20:
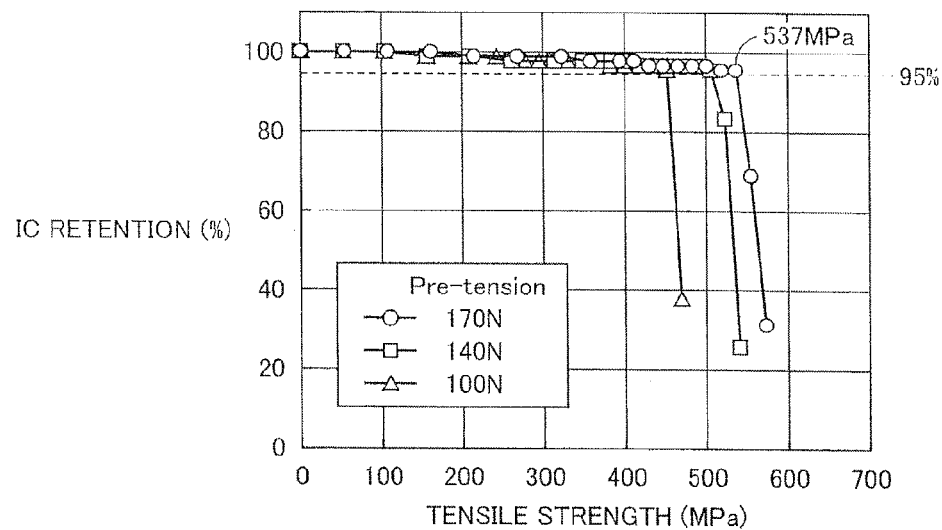
FIG. 20 is a graph showing a relationship between a tensile stress applied to the reinforced superconducting tape and a critical current.

FIG. 20 shows results obtained using MP35N as a reinforcing strip. In FIG. 20, the horizontal axis indicates a tensile strength (unit: MPa) and the vertical axis indicates an Ic retention (unit: %). Three separate types were produced. Each system included a Type H superconducting core and reinforcing strips of MP35N alloy having 0.035 mm thickness (that gives acceptable values for the engineering current density). In generating the three Type-XX samples, three pre-tension values were used: 100N, 140N, and 170N. As shown in the plot of critical current retention (i.e., critical current vs. tensile strength) in FIG. 20, increasing the pre-tension yields increasing critical tensile strengths. The Type-XX produced using 170N pre-tension exhibits a critical tensile strength of 537 MPa. This results shows that, by using MP35N, a BSCCO 2223 based composite tape has been generated that exhibits the desirable property of critical tensile stress exceeding 500 MPa while retaining an acceptable value of the engineering current density. FIG. 20 illustrates tensile stress tolerance data obtained with 0.035 mm thick, MP35N, a material type that meets the modulus, CTE and yield strain specification of the invention and which exhibited stress tolerances of 450 to 537 at increasing tensions in the strip during attachment.

Figure 21:
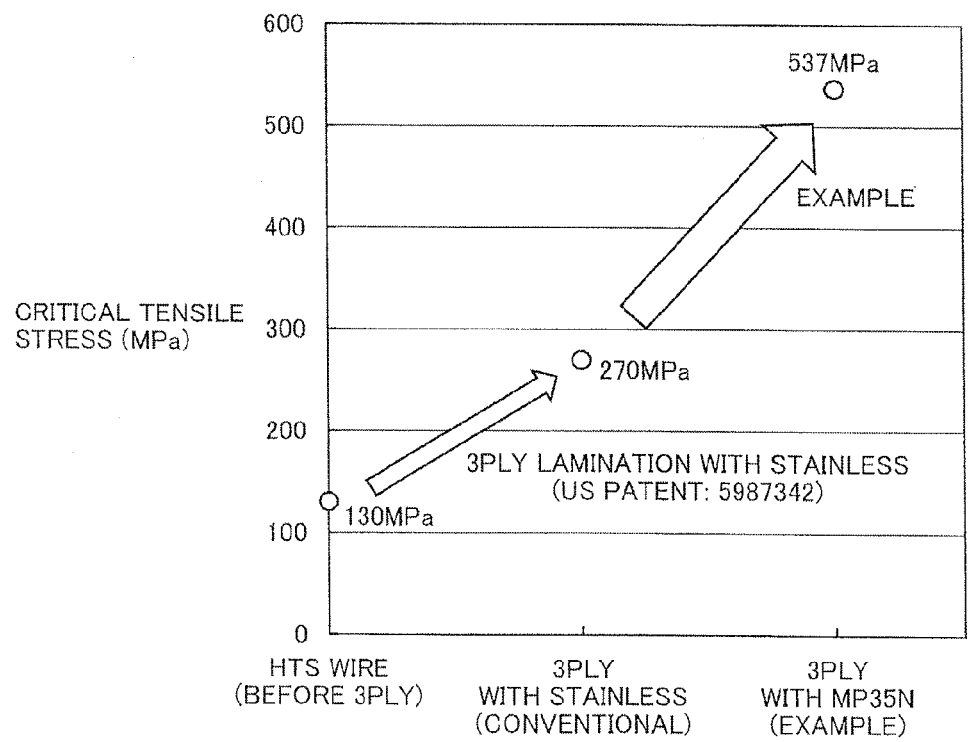
FIG. 21 is a graph showing a critical tensile stress of the reinforced superconducting tape.

FIG. 21 summarizes the success that has been achieved with the disclosed embodiments. In FIG. 21, the horizontal axis indicates the tape shown in FIG. 14, the tape shown in FIG. 15, and the tape according to the present embodiment shown in FIG. 9, and the vertical axis indicates a critical tensile strength (unit: MPa) of each tape. The new embodiments, described above with respect to FIG. 19, exhibit a dramatically improved value of the critical tensile strength of 537 MPa as compared to a conventional structure based on stainless steel having 270 MPa while maintaining a comparable value of the engineering current density. According to the disclosed embodiments, the critical tensile strength has been improved by greater than a factor of four relative to the critical tensile stress of a unreinforced BSCCO-2223/silver tape.

<Summary of Example with MP35N(Registered Trademark)>

Strips of aged alloy MP35N(registered trademark) were manufactured with a cross section of 0.035 mm×4.5 mm. In the best mode, the alloy is cast, then first hot rolled at a temperature above 700° C., then cold rolled with anneals to a strain within about 50 to 70% of the final desired thickness. The sheet is then annealed at above 1000° C. in a controlled atmosphere, and cold rolled to a strain in the 50% to 70% range. The sheet is then aged for about 2 to 6 hours at about 1000 F to 1050 F in a non oxidizing atmosphere, to form the desired high modulus, high yield strain form of the material. The narrow tapes suitable for lamination were produced by slitting from the aged sheet, and they exhibited a proportionality limit tensile strain of about 0.80%, with a corresponding stress of about 1.80 GPa, and an elastic modulus of about 220 GPa. After cleaning, the strips were coated with about 0.0015 mm thick copper by an electroplating method to enhance solder wetting. The strips were then laminated with a high tin solder to superconducting BSCCO 2223/silver tape of nominal dimensions of 0.23 mm×4.3 mm. Lamination was completed with tension in strips at about 170 N. The tensile stress tolerance for start of Ic degradation was measured to be 537 MPa.

The comparison of stainless steel to MP35N and MP159, as well as a measured value on the above described prototype reinforced BSCCO 2223/silver tape are presented in Table 5, illustrating that the materials and approach comprising the invention can produce a reinforced HTS tape with a nominally 25 to 60% higher stress tolerance than stainless steel of similar area fraction.

Examples illustrating the effects of modulus, CTE, proportional limit and tension increases on the tensile strain tolerance of reinforced BSCCO 2223/silver composite tape conductors. Very few practical alloys meet the combination of requirements adequately to produce a substantial (>15%) improvement in stress tolerance above the state of the art attained with stainless steel.

TABLE 5

| | Modulus (GPa) | CTE ppm m/m/K | Proportional Limit Strain (%) | Strain at Attachment (%) | Tension in Strip at Attachment (N) | Stress tolerance (MPa) |
|---|---|---|---|---|---|---|
| Reinforcement Strip Material Type | | | | | | |
| Stainless Steel (Hard temper) | 190 | 16 | 0.30-0.45 | 0.25 | 77 | 414 |
| Larger Modulus | 235 | 16 | 0.30 | 0.25 | 95 | 491 |
| Larger CTE | 190 | 20 | 0.30 | 0.25 | 77 | 485 |
| Larger prop limit strain | 190 | 16 | 0.7 | 0.45 | 168 | 499 |
| Practical alloy examples | | | | | | |
| Aged MP35N ® | 220-235 | 12.8-13.5 | 0.70-0.85 | 0.5-0.70 | 160-225 | 500-580 |
| Aged MP159 ® | 20-243 | 13.8-14.5 | 0.70-0.85 | 0.5-0.70 | 165-230 | 535-630 |
| Hard Beryllium | 300-320 | 11.5 | 0.25-0.35 | 0.20-0.3 | 100-150 | 466-535 |
| Aged MP35N Prototype Tape | NM | NM | 0.8 | NM | 170 | 537 |

For the set of examples in Table 5, the reinforced composite component geometries are:

a) Reinforcement strip: 0.035 mm×4.5 mm in cross section b) BSCCO/Silver tape: 0.226 mm×4.3 mm in cross section c) Solder: about 0.012 mm thickness per reinforcement strip d) Fraction reinforcement: about 20 to 25% e) Components: 1×BSSCO silver tape, 2× reinforcement strips f) Wetting treatment: Reinforcement strips coated with 0.1 to 2 micrometers thick solder wetting material like copper or tin, by for example electroplating.

MP35N(registered trademark) and MP159N(registered trademark) are commercial alloys comprised of Co>30 wt %, Cr>15 wt % and Ni>14 wt %. They exhibit the properties presented in the above table when suitably deformed and aged. They are very rare in that they exhibit very high elastic modulus and proportionality limit strain without a corresponding large decrease in CTE. They are also quite ductile before the final aging step, and can be produced practically in thin strip form with very well controlled thickness and width dimensions.

Beryllium (Be) is also unusual in its combination of high CTE and modulus. However it is very expensive and difficult to produce in thin strip form. Alloys containing in excess of about 20 atomic percentage Be may meet the high modulus-high yield strain high CTE requirement, while also being commercially available.

Greater proportionality limit allows for application of greater tensile load and strain in the reinforcement strip at the point of attachment, allowing for greater axial compression in the BSCCO 2223/silver tape upon release and cool down, and therefore allowing for more tensile loads and strain to be applied to the reinforced composite before reaching the tensile strain limit of the BSCCO 2223.

Table 5 illustrates specific levels of improvement attained by individually increasing CTE, modulus and proportionality limit in conjunction with tensile straining of the reinforcement strips past half way to their proportionality limit strains during attachment. The maximum attachment tension that can be applied strains the reinforcement strips to its proportionality limit. However in order to avoid the possibility of exceeding locally the proportionality limit, the reinforcement is best applied at a maximum stress that corresponds to a strain that exceeds 50% but does not exceed 90% of the proportionality limit. Table 5 also illustrates the stress tolerance that can be attained with state of the art stainless steel as compared to Co—Cr—Ni alloys, specifically for example, alloys known by the trade names MP35N and MP159 and similar alloys and Beryllium and some of its alloys.

Example 2

For the reinforced superconducting tape according to the present embodiment, the following test was conducted to check the influence of pre-tension at the time of manufacturing.

<Sample>

A reinforcement member having a thickness of 0.035 mm and made of MP35N was prepared as the reinforcement member. The superconducting tape shown in FIG. 14 was prepared as the superconducting tape portion. From these reinforcement members and the superconducting tape, a reinforced superconducting tape was manufactured in accordance with the manufacturing method described with reference to FIGS. 7 and 8. However, a sample of reinforced superconducting tape was fabricated under each of two conditions of stress (pre-tension) applied to the reinforcement member, 25 N and 120 N in the step of bonding the reinforcement member to the superconducting tape.

<Experiment>

Figure 22:
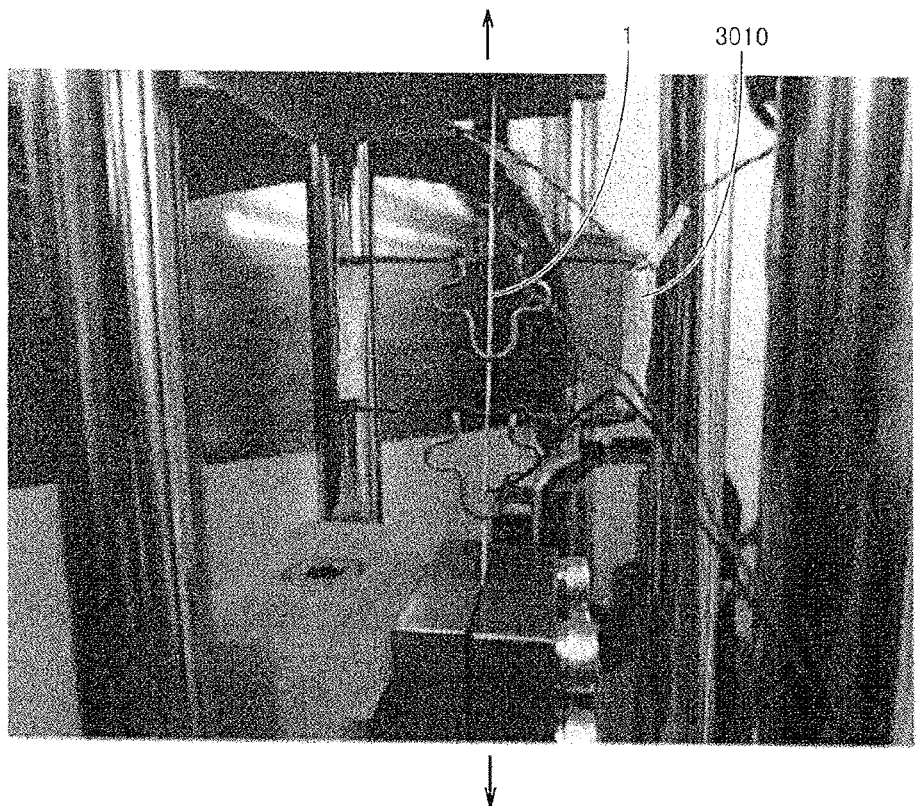
FIG. 22 is a photograph showing a tensile test for the superconducting tape.

A tensile test was conducted on the fabricated sample at a room temperature. The test method was compliant with the international standard IEC61788-18. As shown in FIG. 22, Nyilas gauge 3010 was used as a strain gauge in the test. Nyilas gauge 3010 was attached to reinforced superconducting tape 1 serving as the sample, and a stress was applied in the direction shown by an arrow in FIG. 22 (the extending direction of reinforced superconducting tape 1), and a relationship between the stress and the strain was measured.

<Result>

Figure 23:
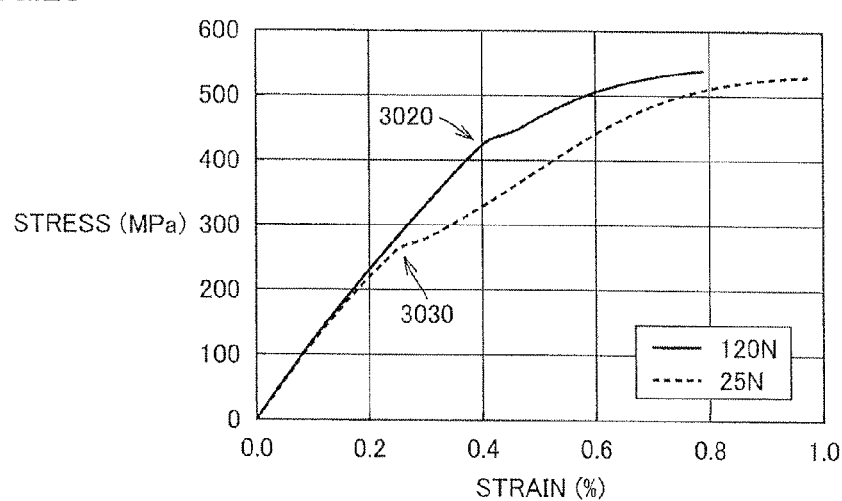
FIG. 23 is a graph showing a result of the tensile test.

The result is shown in FIG. 23. FIG. 23 is a graph showing the experimental result, in which the horizontal axis indicates a strain (unit: %) and the vertical axis indicates a stress (unit: MPa). In FIG. 23, data of the sample in which pre-tension at the time of manufacturing was 120 N is indicated by a solid line, and data of the sample in which pre-tension at the time of manufacturing was 25 N is indicated by a dotted line.

At a portion 3020 in the solid line graph in FIG. 23, the inclination of the graph changes. It is conceivable that this portion where the inclination changes occurs due to fracture of superconductor filaments in the superconducting tape. Similarly, in the dotted line graph in FIG. 23 as well, the inclination of the graph changes at a portion 3030. It is similarly conceivable that this change in inclination occurs due to fracture of superconductor filaments.

As can be seen from FIG. 23, in the sample to which the larger pre-tension was applied, the change in inclination of the graph occurred at higher stress. In other words, it can be seen that the sample to which the larger pre-tension was applied was able to withstand applied stress without causing fracture of the superconductor filament until a higher applied stress level was reached.

INDUSTRIAL APPLICABILITY

The aforementioned reinforced superconducting tape is advantageously applicable to a device that generates a magnetic field by using a coil formed of MRI, NMR or other superconducting tape.

REFERENCE SIGNS LIST

1 reinforced superconducting tape, 108 three-ply structure, 110 upper thin layer of reinforcement tape, 112 lower thin layer of reinforcement tape, 114 thin layer of Type H HTS tape, 120, 1020 superconducting tape portion, 122 layer of Ag-alloy, 202 structure, 204, 206, 208, 210 stress, 402, 404 reinforcement tape, 405 tension, 408 resulting structure, 409 compressive residual stress, 412 thermal stress, 802 bare HTS tape, 804 stainless steel reinforced tape, 806 copper alloy reinforced tape, 902 pull-off section, 904 soldering section, 906 take-up section, 1030 reinforcement member, 1040 joining material, 2021 oriented substrate, 2022 superconductor layer, 2023 stabilized layer, 2024 protective layer.

The invention claimed is:

1. A reinforced superconducting wire, comprising:
   a superconducting tape portion, said superconducting tape portion being in a state of compressive residual stress; and
   a reinforcement member connected to said superconducting tape portion, wherein
   a material forming said reinforcement member includes nickel, cobalt and chromium, and
   in said material forming said reinforcement member,
   said nickel is in a range from 20 wt % or more to 42 wt % or less,
   said cobalt is in a range from 23 wt % or more to 44 wt % or less, and
   said chromium is in a range from 14 wt % or more to 26 wt % or less.

2. The reinforced superconducting wire according to claim 1, wherein said reinforcement member is coated with a surface material layer.

3. The reinforced superconducting wire according to claim 2, wherein said surface material layer includes at least one metal selected from the group consisting of copper, tin, gold, silver, platinum group metals, gallium, and indium.

4. The reinforced superconducting wire according to claim 1, wherein said nickel is in a range from 25 wt % or more to 37 wt % or less.

5. The reinforced superconducting wire according to claim 1, wherein said cobalt is in a range from 28 wt % or more to 39 wt % or less.

6. The reinforced superconducting wire according to claim 1, wherein said chromium is in a range from 19 wt % or more to 21 wt % or less.

7. The reinforced superconducting wire according to claim 1, wherein said material forming said reinforcement member further includes titanium.

8. The reinforced superconducting wire according to claim 1, wherein said reinforcement member is such that a characteristic value FOM defined in accordance with the following equation exceeds 1050% GPa/K:
   FOM=CTE×Proportionality Limit Strain×Modulus all in the 273K to 323K temperature range, and where CTE is in PPM m/m/K, Elastic Modulus is in GPa and Proportionality Limit is in percent.

9. The reinforced superconducting wire according to claim 1, wherein a rate of decrease in a critical current value when a tensile stress of 400 MPa is applied, to a critical current value when a tensile stress is not applied is 5% or less.

10. The reinforced superconducting wire according to claim 1, wherein said reinforcement member is in tension and applies the compressive residual stress to said superconducting tape core.

11. The reinforced superconducting wire according to claim 1, wherein said reinforcement member is in tension and generates a tensile strain within a range of 0.25% to 0.8% in the reinforced superconducting wire.

12. The reinforced superconducting wire according to claim 1, wherein said reinforcement member is in tension within a range of 25 N to 230 N.

13. The reinforced superconducting wire according to claim 1, wherein said reinforcement member is in tension within a range of 100 N to 230 N.

14. A reinforced high temperature superconductor comprised of a) a BSCCO 2223/silver tape core in a state of compressive residual stress, b) two reinforcement strips, one on each side of the broad surfaces of the tape c) a joining material comprised primarily of an organic adhesive or solder containing in excess of 5% of any one of Sn, Pb, In, Sb or Bi between the reinforcement strips and BSCCO 2223/silver tape core, coating the outside of the assembly and between the reinforcement strips at the edges of the assembly such that the reinforcement occupies less than 35% of the total composite cross sectional area and where the critical current of the composite is not degraded by more than 5% with an applied tensile stress in excess of 400 MPa at a temperature of 300 K or lower.

\* \* \* \* \*